United States Patent
Liao et al.

(10) Patent No.: US 12,147,159 B2
(45) Date of Patent: *Nov. 19, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Sih-Hao Liao, New Taipei (TW); Yu-Hsiang Hu, Hsinchu (TW); Hung-Jui Kuo, Hsinchu (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/870,388

(22) Filed: Jul. 21, 2022

(65) Prior Publication Data

US 2022/0382150 A1 Dec. 1, 2022

Related U.S. Application Data

(63) Continuation of application No. 17/021,222, filed on Sep. 15, 2020, now Pat. No. 11,454,888.

(51) Int. Cl.
| | | |
|---|---|---|
| *H01L 23/00* | (2006.01) | |
| *C08K 5/375* | (2006.01) | |
| *G03F 7/031* | (2006.01) | |
| *H01L 23/31* | (2006.01) | |
| *H01L 23/538* | (2006.01) | |

(52) U.S. Cl.
CPC .............. *G03F 7/031* (2013.01); *C08K 5/375* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 24/24* (2013.01); *H01L 2224/214* (2013.01); *H01L 2224/215* (2013.01); *H01L 2224/24137* (2013.01)

(58) Field of Classification Search
CPC ........................ H01L 23/5383; H01L 23/5386
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,658,199 B2 | 5/2020 | Liao et al. |
| 11,454,888 B2 * | 9/2022 | Liao .................. H01L 21/311 |
| 2011/0198762 A1 * | 8/2011 | Scanlan ................. H01L 24/20 |
| | | 257/793 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2018/0061669 A1 | 3/2018 | Liao et al. |
| 2022/0291585 A1 * | 9/2022 | Shimizu ................ G03F 7/0387 |

* cited by examiner

*Primary Examiner* — David A Zarneke

(74) *Attorney, Agent, or Firm* — Slater Matsil, LLP

(57) ABSTRACT

A method of manufacturing a semiconductor device includes forming a polymer mixture over a substrate, curing the polymer mixture to form a polymer material, and patterning the polymer material. The polymer mixture includes a polymer precursor, a photosensitizer, a cross-linker, and a solvent. The polymer precursor may be a polyamic acid ester. The cross-linker may be tetraethylene glycol dimethacrylate. The photosensitizer includes 4-phenyl-2-(piperazin-1-yl)thiazole. The mixture may further include an additive.

20 Claims, 26 Drawing Sheets

SEMICONDUCTOR DEVICE AND METHOD OF MANUFACTURE

PRIORITY CLAIM AND CROSS-REFERENCE

This application is a continuation of U.S. patent application Ser. No. 17/021,222, filed on Sep. 15, 2020, now U.S. Pat. No. 11,454,888, issued Sep. 27, 2022, entitled "Semiconductor Device and Method of Manufacture," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
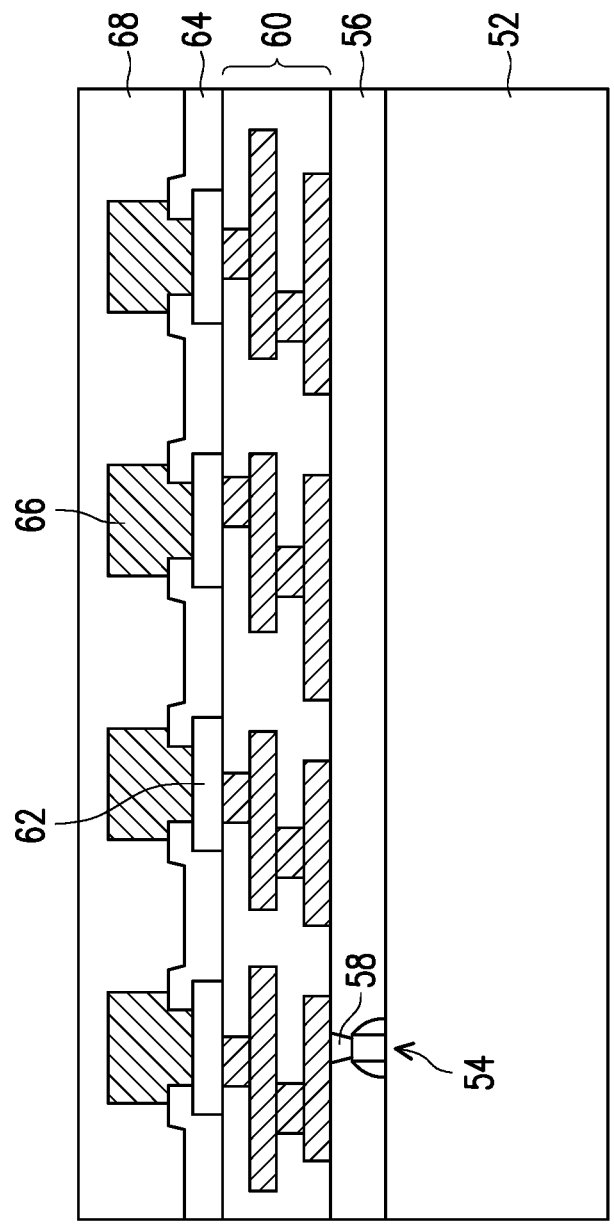
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which a polyimide material is utilized to form dielectric layers with a semiconductor device. The embodiments described, however, are not intended to be limited to the embodiments described herein, and may be utilized in a wide variety of embodiments.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies, such as e.g. by a sawing process. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars or vias (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50, such as by a grinding process. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 20 illustrate cross-sectional views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
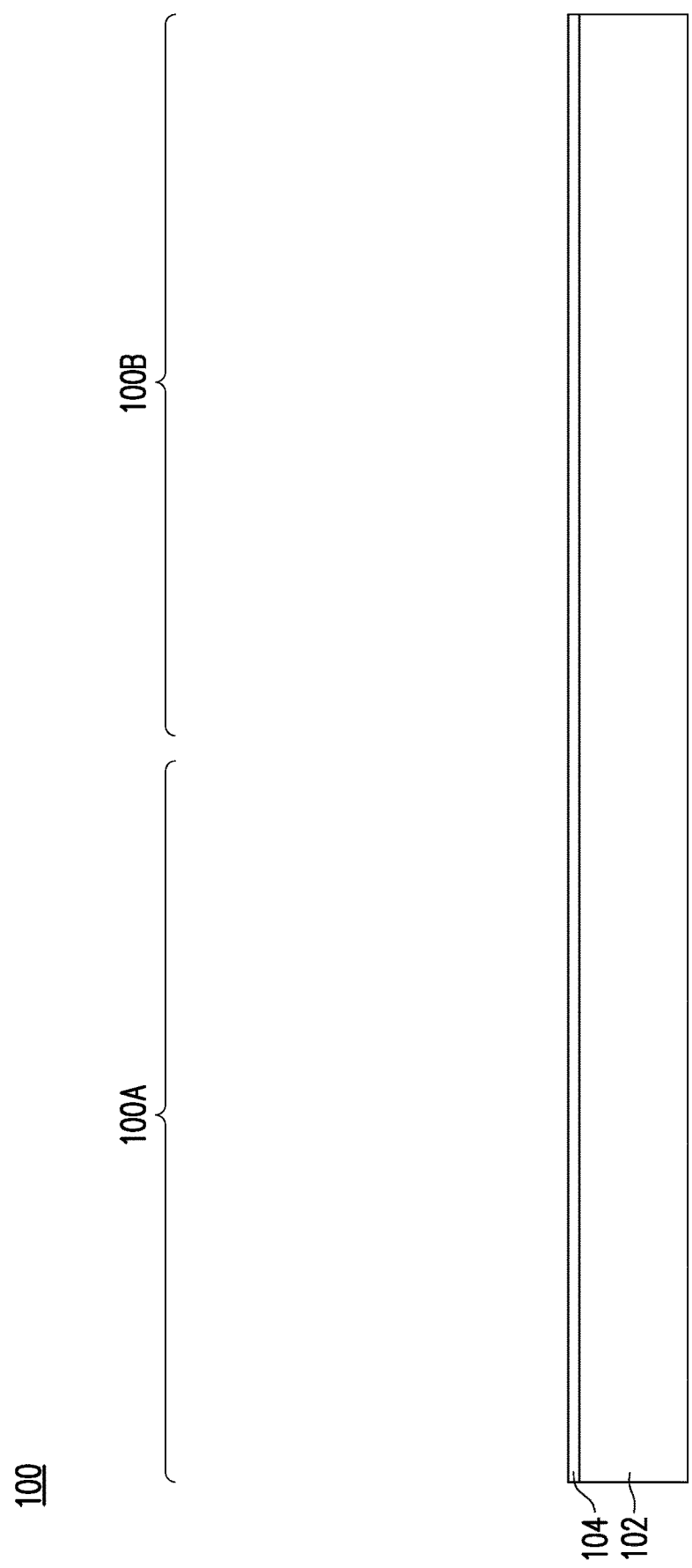
FIGS. 2 through 8 illustrate cross-sectional views of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
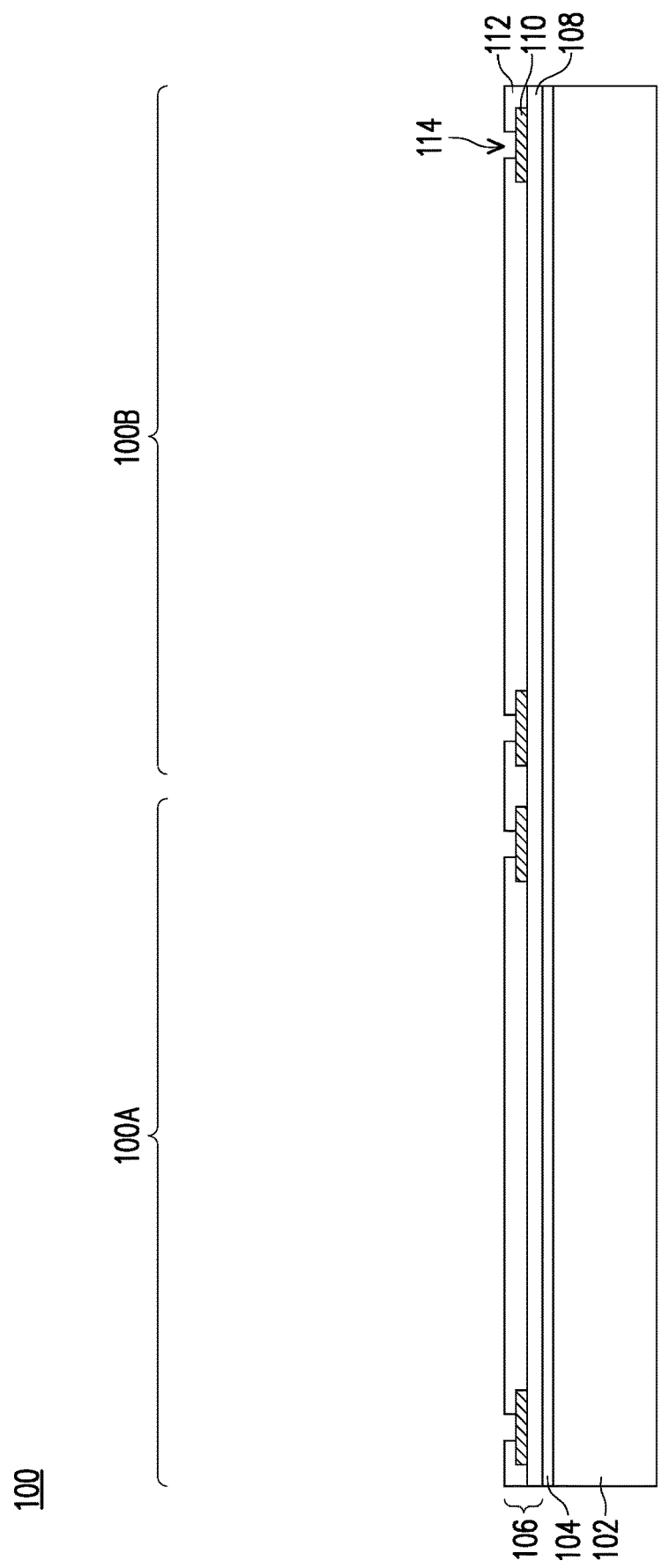

In FIG. 3, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure.

FIG. 3 illustrates a redistribution structure 106 having a single metallization pattern 110 for illustrative purposes. In some embodiments, the back-side redistribution structure 106 may include any number of dielectric layers and metallization patterns. If more dielectric layers and metallization patterns are to be formed, steps and processes discussed above may be repeated. The metallization patterns may include one or more conductive elements, such as conductive lines and vias. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

Figure 4:
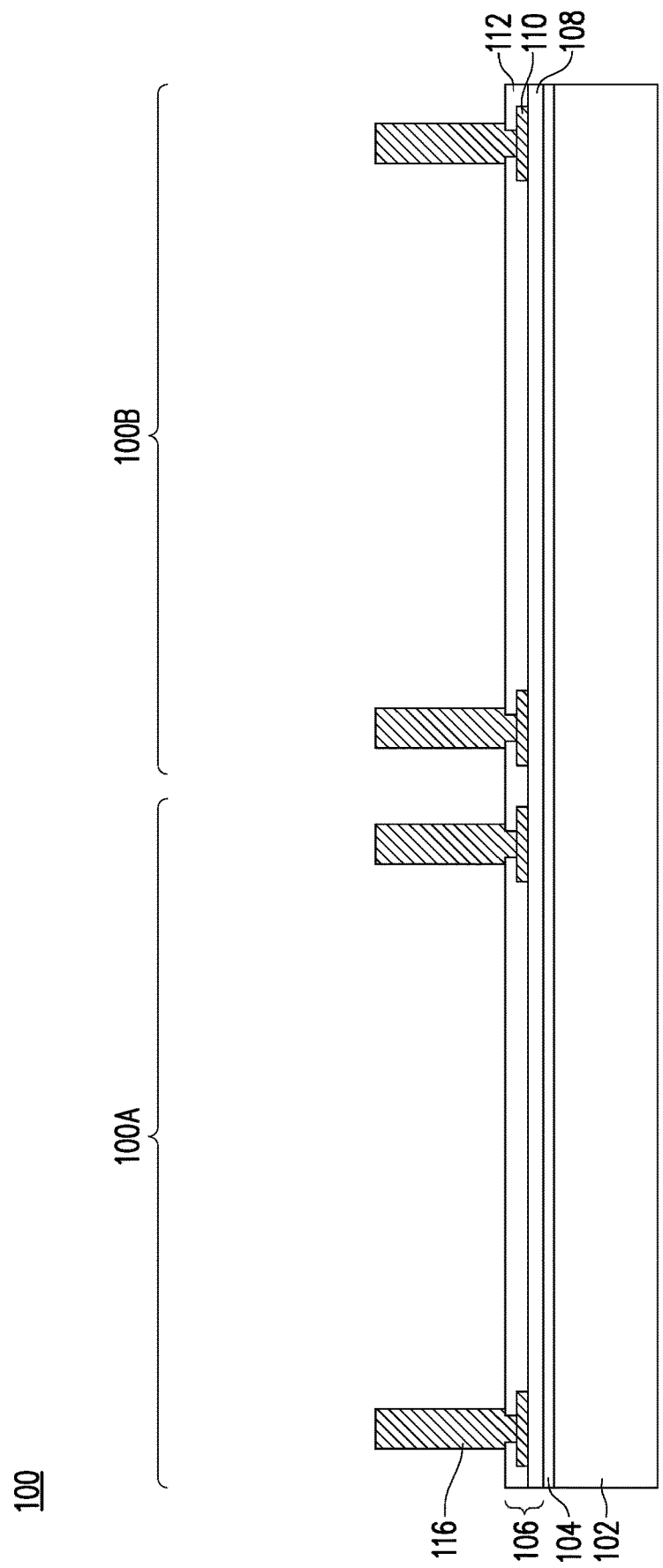

In FIG. 4, through vias 116 are formed in the openings 114 and extending away from the topmost dielectric layer of the back-side redistribution structure 106 (e.g., the dielectric layer 112). As an example to form the through vias 116, a seed layer (not shown) is formed over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 5:
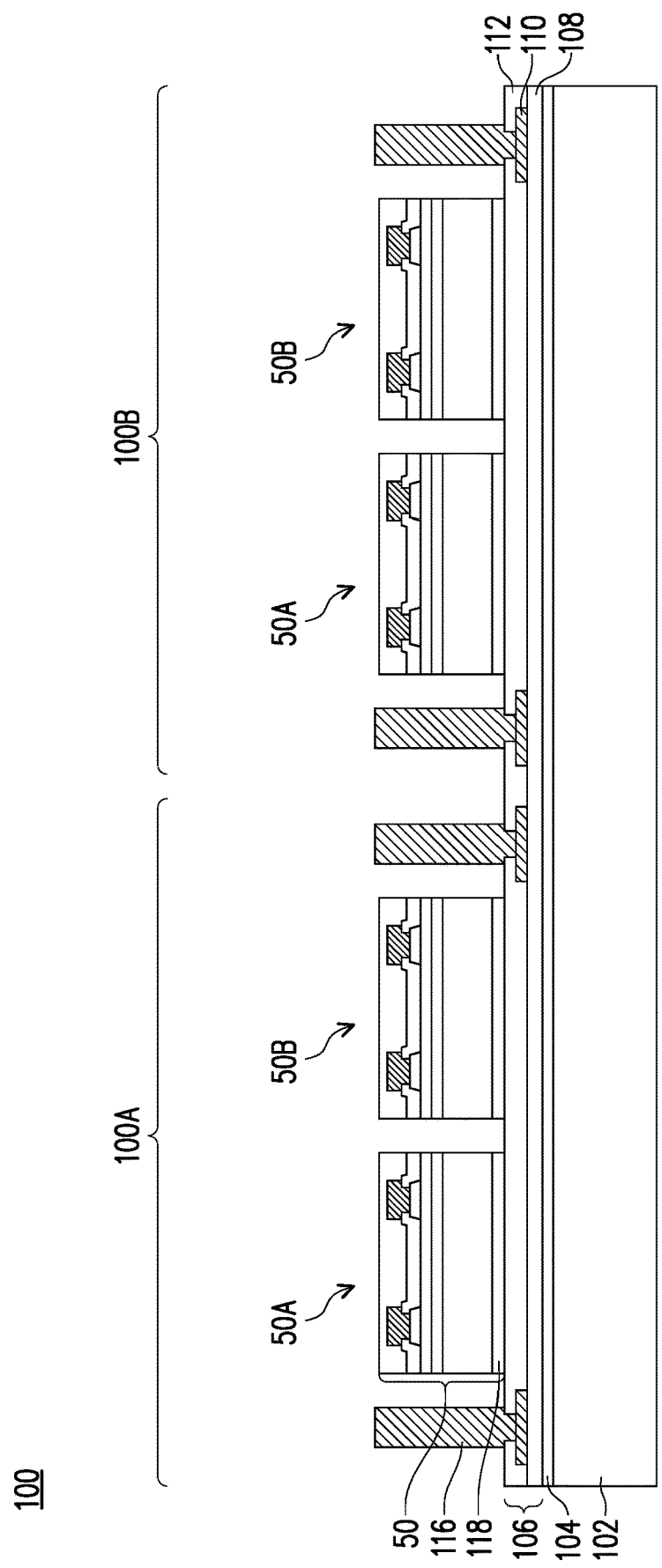

In FIG. 5, integrated circuit dies 50 (e.g., a first integrated circuit die 50A and a second integrated circuit die 50B) are adhered to the dielectric layer 112 by an adhesive 118. A desired type and quantity of integrated circuit dies 50 are adhered in each of the package regions 100A and 100B. In the embodiment shown, multiple integrated circuit dies 50 are adhered adjacent one another, including the first integrated circuit die 50A and the second integrated circuit die 50B in each of the first package region 100A and the second package region 100B. The first integrated circuit die 50A may be a logic device, such as a system-on-a-chip (SoC), a central processing unit (CPU), a graphics processing unit (GPU), a microcontroller, or the like. The second integrated circuit die 50B may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the first package region 100A and the second package region 100B may be limited, particularly when the integrated circuit dies 50 include devices with a large footprint, such as SoCs. Use of the back-side redistribution structure 106 allows for an improved interconnect arrangement when the first package region 100A and the second package region 100B have limited space available for the through vias 116. In some embodiments, the space between adjacent integrated circuit dies 50 is in a range of about 60 μm to about 100 μm.

The adhesive 118 is on back-sides of the integrated circuit dies 50 and adheres the integrated circuit dies 50 to the back-side redistribution structure 106, such as to the dielectric layer 112. The adhesive 118 may be any suitable adhesive, epoxy, die attach film (DAF), or the like. The adhesive 118 may be applied to back-sides of the integrated circuit dies 50, may be applied over the surface of the carrier substrate 102 if no back-side redistribution structure 106 is utilized, or may be applied to an upper surface of the back-side redistribution structure 106 if applicable. For example, the adhesive 118 may be applied to the back-sides of the integrated circuit dies 50 before singulating to separate the integrated circuit dies 50.

Figure 6:
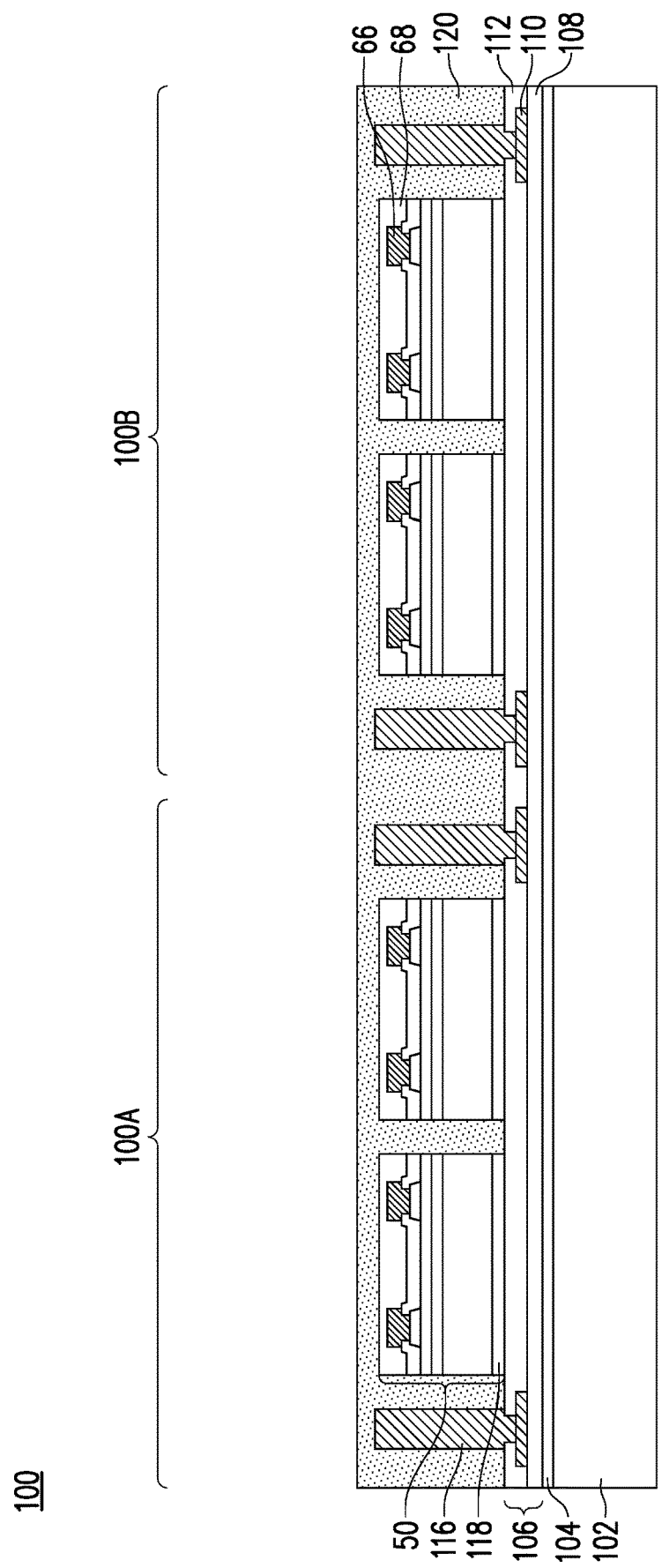

In FIG. 6, an encapsulant 120 is formed on and around the various components. After formation, the encapsulant 120 encapsulates the through vias 116 and integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50. The encapsulant 120 may be applied in liquid or semi-liquid form and then subsequently cured.

Figure 7:
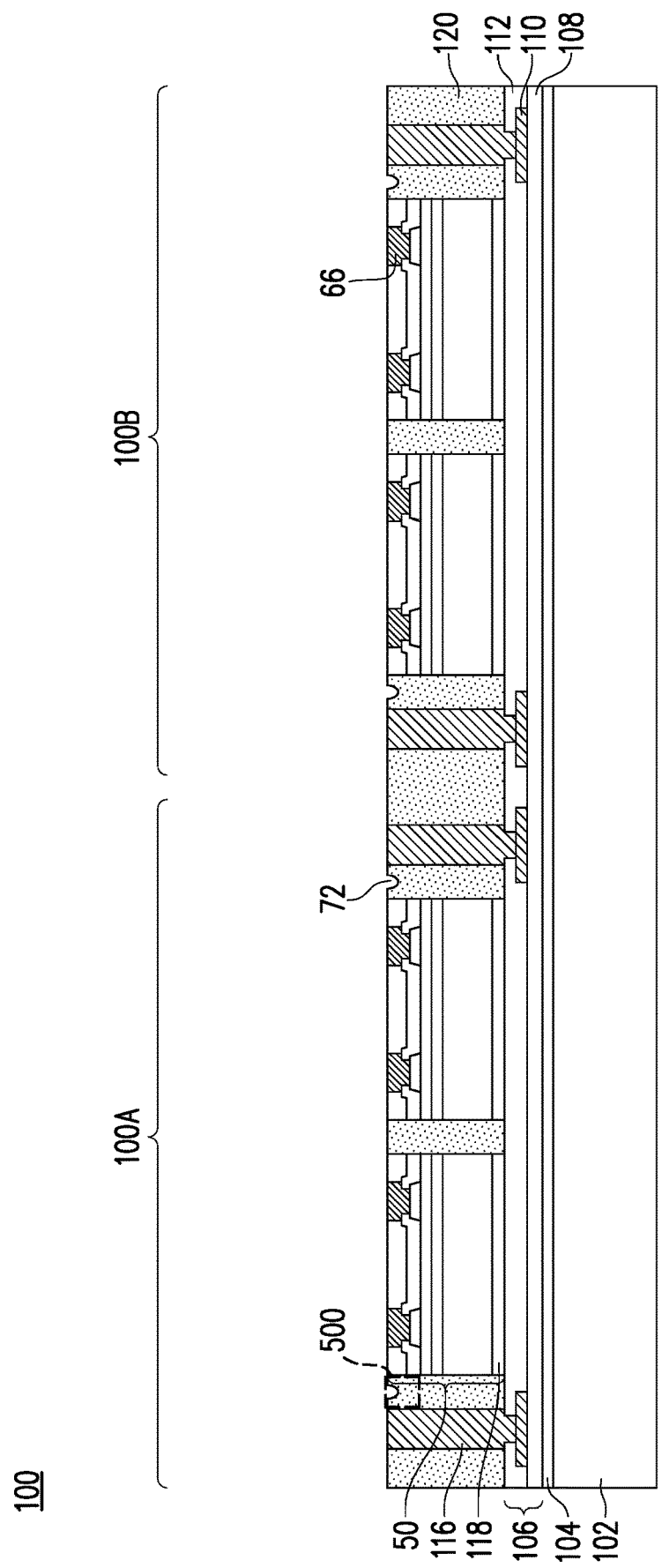

In FIG. 7, a planarization process is performed on the encapsulant 120 to expose the through vias 116 and the die connectors 66. The planarization process may also remove material of the through vias 116, dielectric layer 68, and/or die connectors 66 until the die connectors 66 and through vias 116 are exposed. Top surfaces of the through vias 116, die connectors 66, dielectric layer 68, and encapsulant 120 are substantially coplanar after the planarization process within process variations. The planarization process may be, for example, a chemical-mechanical polish (CMP), a grinding process, or the like. In some embodiments, the planarization may be omitted, for example, if the through vias 116 and/or die connectors 66 are already exposed.

Figure 8:
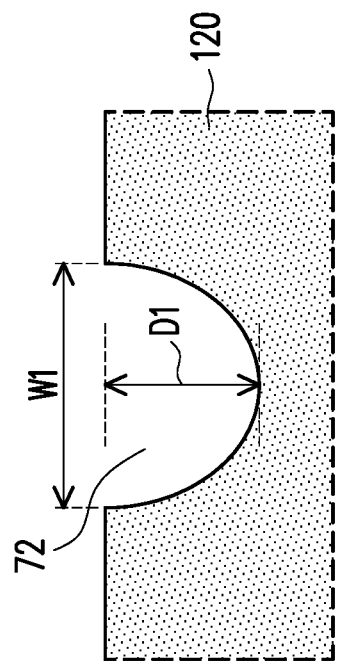
Figure 9:
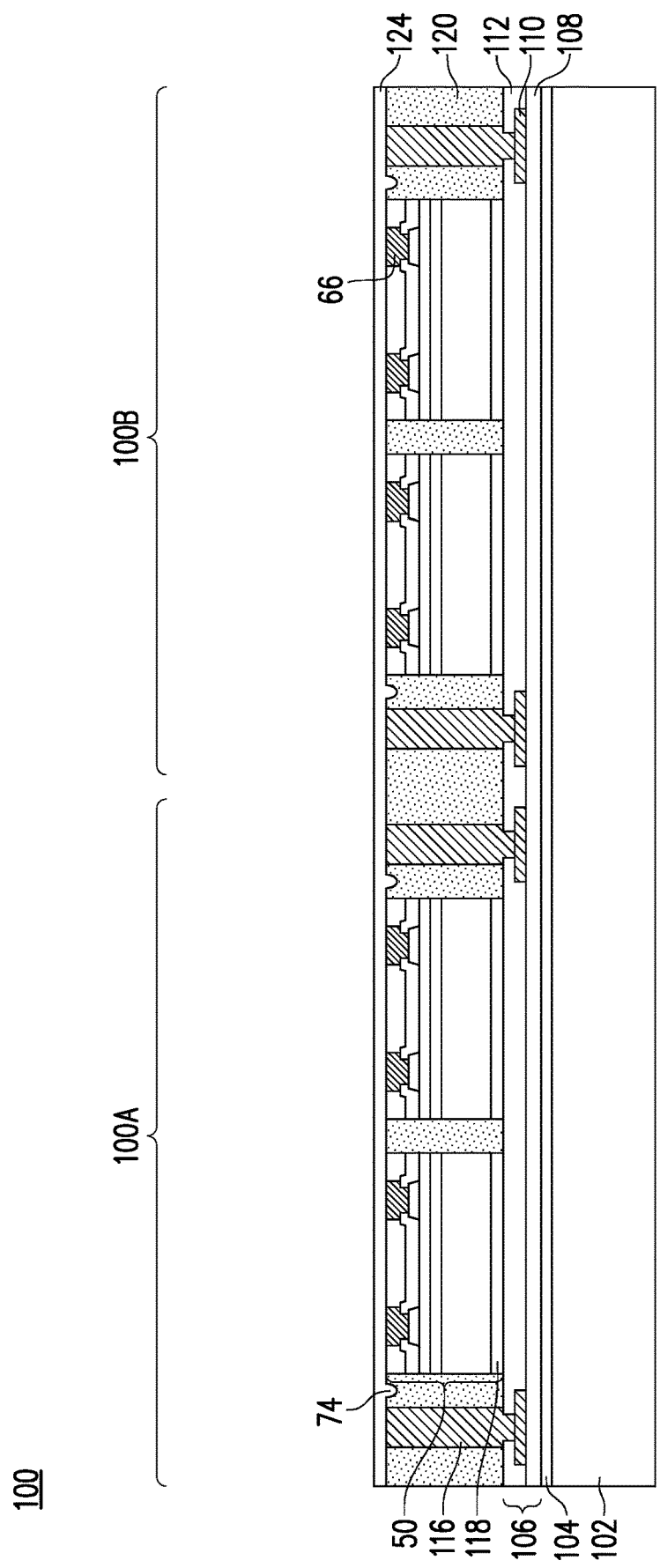
FIG. 9 illustrates a cross-sectional view of a formation of a dielectric layer of the package component in accordance with some embodiments.

FIG. 8 illustrates a detailed view of region 500 of FIG. 7, showing a close-up view of molding pits 72 in the top surface of the encapsulant 120 in accordance with some embodiments. In some embodiments in which the planarization process is a grinding process, molding pits 72 in the top surface of the encapsulant 120 may be formed by the grinding process. The molding pits 72 may have widths W1 in a range from about 15 μm to about 25 μm and depths D1 of greater than about 10 μm below the top surface of the encapsulant 120. Molding pits 72 can induce defects in subsequently formed redistribution layers (RDLs) that may reduce production yield by causing issues such as broken RDL lines due to RDL bridging. As described below with respect to FIG. 14, a front-side redistribution structure 122 formed with a polymer material may efficiently fill the molding pits 72 and reduce the RDL bridge rate, such as to a bridge rate of about 0%.

In FIGS. 9 through 18, a front-side redistribution structure 122 (see FIG. 17) is formed over the encapsulant 120, through vias 116, and integrated circuit dies 50. The front-side redistribution structure 122 includes dielectric layers 124, 128, 132, and 136; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns, such as two to five dielectric layers and metallization patterns, may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

Returning now to FIG. 9, the dielectric layer 124 is formed on the encapsulant 120, through vias 116, and die connectors 66. In some embodiments, the dielectric layer 124 may be formed from a polymer material comprising a solvent, a polymer precursor, a cross-linker, and a photosensitizer. The mixture may further comprise an additive.

In some embodiments in which the low-temperature cured polyimide is used for the composition, the polymer material may comprise a polyimide precursor, such as a polyamic acid ester, along with a photosensitizer, cross-linker, and additives placed into a solvent. In an embodiment the polyamic acid ester may comprise a polymer that is made up of monomers of the following formula:

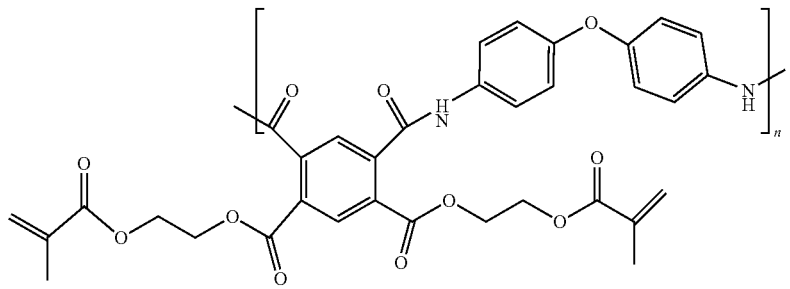

Additionally, while the polyamic acid ester may be one of the embodiments of a polyimide precursor as described above, the polyimide precursor is not intended to be limited to only the specific examples described herein. Rather, any suitable polyimide precursor may be utilized, and all such polyimide precursors are fully intended to be included within the scope of the embodiments. For example, the polymer material may comprise about 25-35% by weight polymer precursor.

In some embodiments the solvent comprises an organic solvent which may be used in order to mix, transport, and disperse the remaining components of the polymer material.

As such, in some embodiments the organic solvent may comprise gamma-butyrolactone (GBL), NMP (N-Methyl-2-Pyrrolidone), or DMAC (Dimethylacetamide). However, any suitable organic solvent may be utilized.

In additional embodiments the solvent may additionally comprise not only the organic solvent as described above, but may also comprise a second solvent in order to achieve good solubility of the polymer precursor. In such embodiments, the solvent may comprise not only gamma-butyrolactone (GBL), but may also comprise a second organic solvent such as dimethyl sulfoxide (DMSO), EL (Ethyl lactate), or the like. However, any suitable organic solvent may be utilized for the second organic solvent.

In some embodiments, the polymer material comprises about 40% to about 50% by weight GBL. Using about 40% to about 50% by weight GBL may be useful for achieving good solubility with the polymer precursor. Using less than about 40% by weight GBL may be disadvantageous because it may lead to precipitation. Using more than about 50% by weight GBL may be disadvantageous because the polymer precursor may be too low, which may lead to subsequent formation of an overly thin film thickness.

In some embodiments, the polymer material comprises about 5% to about 15% by weight DMSO. Using about 5% to about 15% by weight DMSO may be useful for achieving good solubility with the polymer precursor. Using less than about 5% by weight DMSO may be disadvantageous because it may lead to precipitation. Using more than about 15% by weight DMSO may be disadvantageous because the polymer precursor may be too low, which may lead to subsequent formation of an overly thin film thickness.

Using a mixture of GBL and DMSO as the solvent may provide advantages. The mixture of GBL and DMSO may be referred to as a green mixing solvent because it is environmentally friendly. Using GBL and DMSO may reduce pollution of the environment as GBL and DMSO are less toxic than other solvents such as, e.g., n-methyl-2-pyrrolidone or n-methylpyrrolidone (NMP), N,N-dimethylformamide or dimethylformamide (DMF), or the like.

The cross-linker forms bonds that link one polymer chain to another. The resulting composition may have a greater rigidity than it otherwise would have without cross-linking. In some embodiments, the cross-linker may comprise any suitable cross-linking agent, such as tetraethylene glycol dimethacrylate (acrylate). In other embodiments, a cross-linking agent is not used in the mixture to form the polymer material, and the polymer material does not comprise a cross-linker.

Increasing the concentration of the cross-linker may be beneficial for reducing the curing temperature of the polymer material. For example, the polymer material comprising about 2% to about 10% by weight cross-linker may allow for better lithography patterning. The polymer material comprising less than about 2% by weight cross-linker may result in worse lithography patterning. The polymer material comprising more than about 10% by weight cross-linker may result in worse lithography patterning.

The photosensitizers, also referred to as photoactivators or photoactive components (PACs), may be photoactive components such as photoacid generators, photobase generators, free-radical generators, or the like, and the photosensitizers may be positive-acting or negative-acting. In some embodiments, the photosensitizer comprises 4-phenyl-2-(piperazin-1-yl)thiazole. Using 4-phenyl-2-(piperazin-1-yl)thiazole as the photosensitizer may be useful for improving resolution of critical dimensions and reducing development time. The polymer material may comprise about 0.1% to about 2.5% by weight 4-phenyl-2-(piperazin-1-yl)thiazole, which may be beneficial for achieving reduction of development time and higher resolution for RDL features. The polymer material comprising less than about 0.1% by weight 4-phenyl-2-(piperazin-1-yl)thiazole may be disadvantageous due to resulting in longer development times and worse resolution for RDL features. The polymer material comprising more than about 2.5% by weight 4-phenyl-2-(piperazin-1-yl)thiazole may be disadvantageous due to resulting in longer development times and worse resolution for RDL features.

Figure 10A:
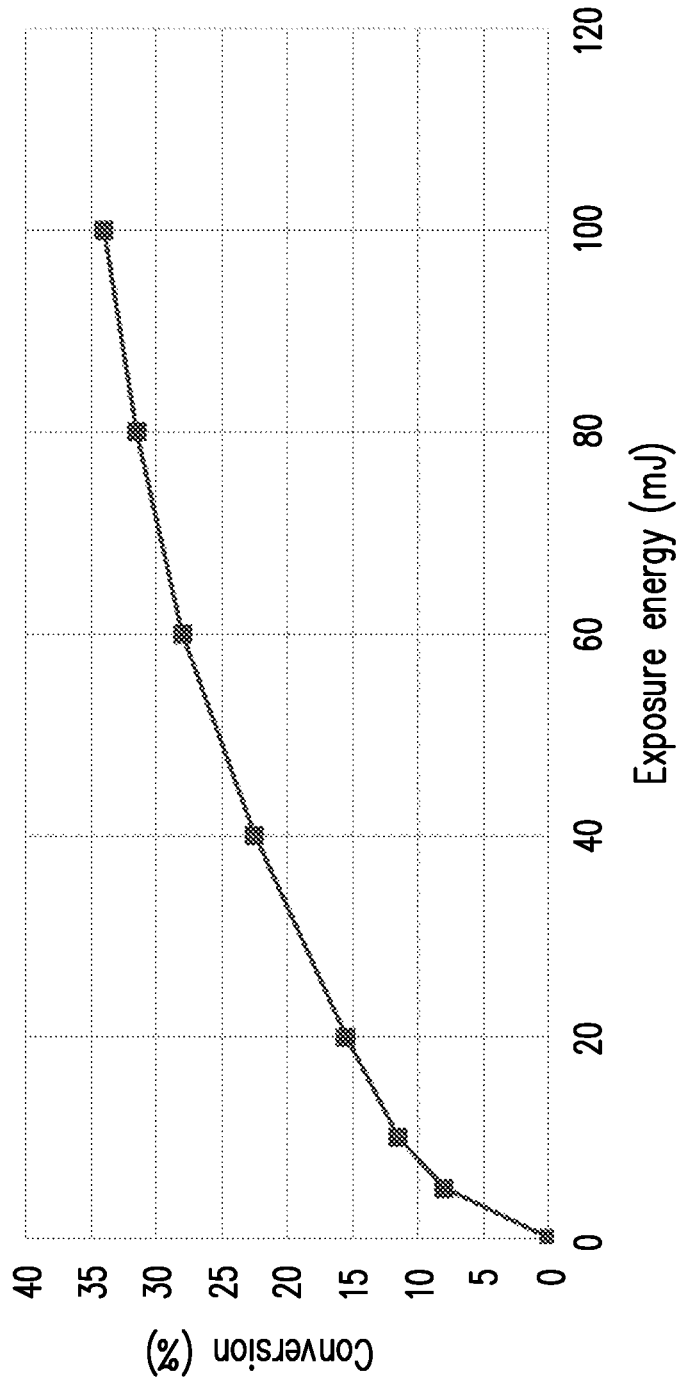
FIGS. 10A and 10B further illustrate the formation of the dielectric layer of the package component in accordance with some embodiments.

FIG. 10A illustrates a graph of the conversion percentage of the polymer material versus exposure energy. The use of 4-phenyl-2-(piperazin-1-yl)thiazole as the photosensitizer may increase the conversion percentage of the polymer material with respect to exposure energy, so that a conversion percentage in a range of about 33% to about 35% can be achieved with an exposure energy in a range of about 90 mJ to about 110 mJ.

Figure 10B:
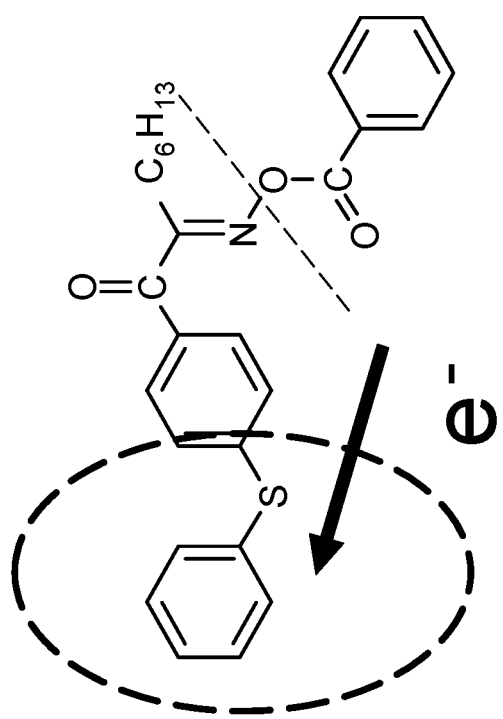

FIG. 10B illustrates how an enhanced photosensitivity with respect to exposure energy may be achieved. For example, by adding a thiobenzene group to the photosensitizer formula, shown by the circled portion of the formula of 4-phenyl-2-(piperazin-1-yl)thiazole, the electron generated during exposure of the thiobenzene group will react with the electron instead of the electron reacting elsewhere and reducing the overall conversion. The resulting higher photosensitivity at relatively lower exposure energies may allow higher resolution of RDL features to be produced with a low temperature plasma ionization (LTPI) development procedure, as described below.

In addition to the photosensitizer, the mixture may also comprise an additive. The additive helps to reduce the temperature used for curing. In particular, the additive may serve to increase the free volume of the mixture. The high polarity and/or high steric hindrance of the additive may serve to overcome the polarity—e.g., by lowering the dipole moment—of the polymers formed during and after exposure. Consequently, as discussed below, a lower exposure energy may be used. The reduced polarity across the reactive portions of the polymer allow branches of the molecules to come together to form rings and thereby improve the cyclization during curing at the lower temperature. The additive may serve as a catalyst to the reaction and, therefore, remain separate from the polymer before and after curing, although, the final polymer layer or dielectric layer, after curing, may comprise some or all of the original additive.

The additive may comprise any molecule suitable for increasing the free volume of the polymer material or polymer mixture. In order to increase the free volume of the mixture, the additive may be selected and may have a structure similar to the selected photosensitizer, (4-phenyl-2-(piperazin-1-yl)thiazole). For example, in some embodiments the additive comprises one or more of the chemicals described by the following formula:

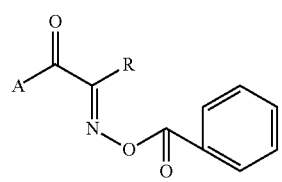

wherein R comprises $CH_3$ or $C_6H_{13}$, wherein A is described by one of the following formulas:

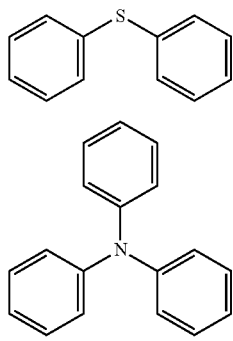

For example, in an embodiment in which R is CH$_3$, the additive may have the following formula:

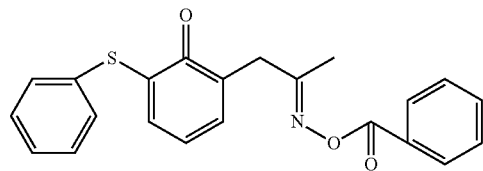

In another embodiment in which R is C$_6$H$_{13}$, the additive may have the following formula:

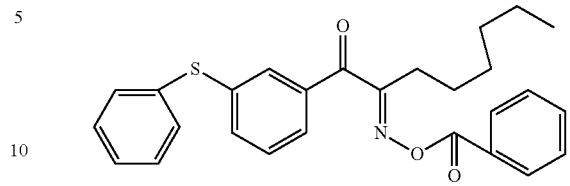

In another example, in an embodiment in which R is CH$_3$, the additive may have the following formula:

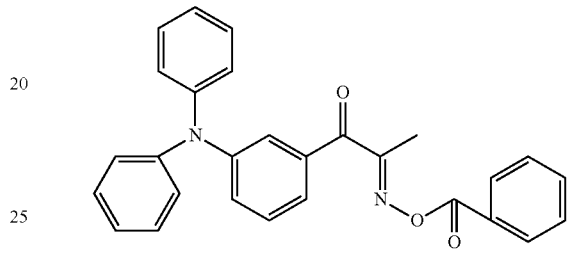

In another embodiment in which R is C$_6$H$_{13}$, the additive may have the following formula:

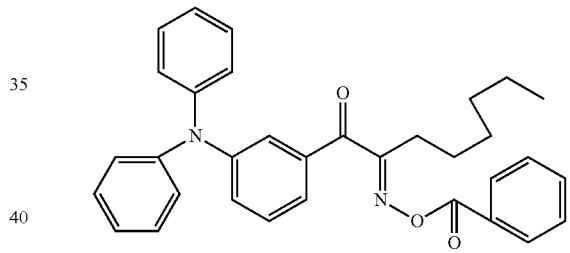

In another example, in an embodiment in which R is CH$_3$, the additive may have the following formula:

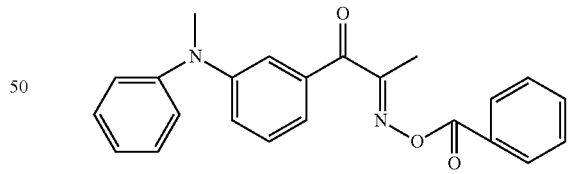

In another embodiment in which R is C$_6$H$_{13}$, the additive may have the following formula:

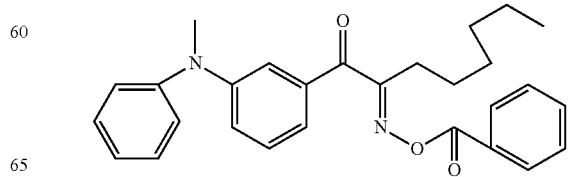

In another example, in an embodiment in which R is CH₃, the additive may have the following formula:

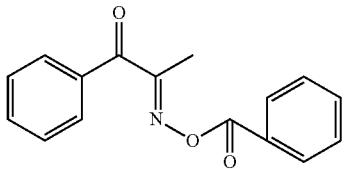 [SMILES: C/C(=N\OC(=O)c1ccccc1)C(=O)c1ccccc1]

In another embodiment in which R is C₆H₁₃, the additive may have the following formula:

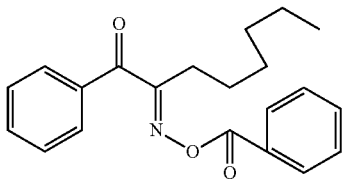 [SMILES: CCCCCC/C(=N\OC(=O)c1ccccc1)C(=O)c1ccccc1]

In another example, in an embodiment in which R is CH₃, the additive may have the following formula:

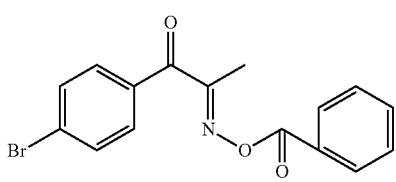 [SMILES: C/C(=N\OC(=O)c1ccccc1)C(=O)c1ccc(Br)cc1]

In another embodiment in which R is C₆H₁₃, the additive may have the following formula:

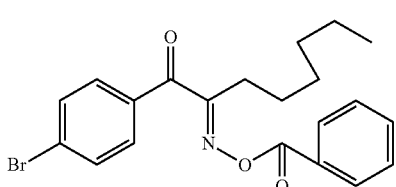

In another example, in an embodiment in which R is CH₃, the additive may have the following formula:

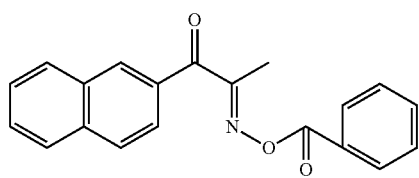 [SMILES: C/C(=N\OC(=O)c1ccccc1)C(=O)c1ccc2ccccc2c1]

In another embodiment in which R is C₆H₁₃, the additive may have the following formula:

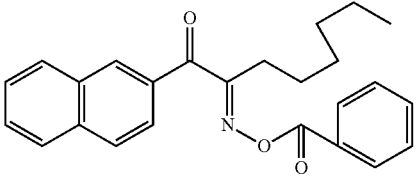 [SMILES: CCCCCC/C(=N\OC(=O)c1ccccc1)C(=O)c1ccc2ccccc2c1]

In another example, in an embodiment in which R is CH₃, the additive may have the following formula:

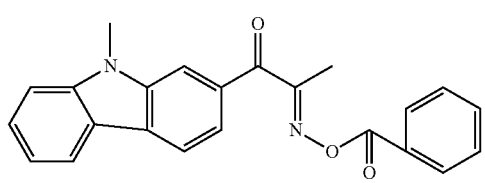 [SMILES: C/C(=N\OC(=O)c1ccccc1)C(=O)c1ccc2c3ccccc3n(C)c2c1]

In another embodiment in which R is C₆H₁₃, the additive may have the following formula:

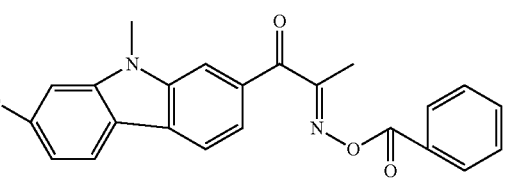

In another example, in an embodiment in which R is CH₃, the additive may have the following formula:

In another embodiment in which R is C₆H₁₃, the additive may have the following formula:

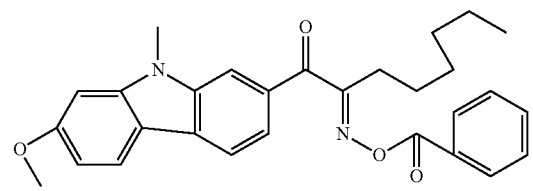 [SMILES: CCCCCC/C(=N\OC(=O)c1ccccc1)C(=O)c1ccc2c3ccc(OC)cc3n(C)c2c1]

In another example, in an embodiment in which R is CH₃, the additive may have the following formula:

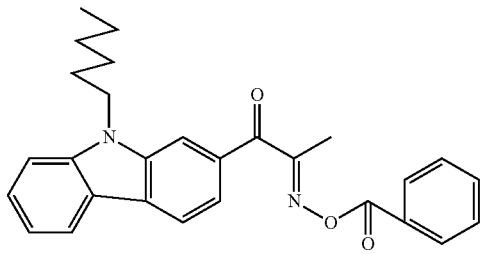 [SMILES: CCCCCCn1c2ccccc2c2ccc(C(=O)/C(C)=N/OC(=O)c3ccccc3)cc21]

In another embodiment in which R is C₆H₁₃, the additive may have the following formula:

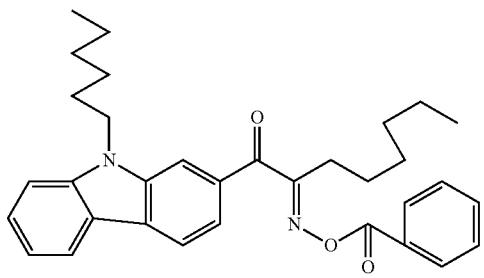 [SMILES: CCCCCC/C(=N\OC(=O)c1ccccc1)C(=O)c1ccc2c3ccccc3n(CCCCCC)c2c1]

In other embodiments, the additive comprises one or more of the following chemicals: 2-Benzyl-2-(dimethylamino)-1-[4-(morpholinyl) phenyl)]-1-butanone, (2-dimethylamino-2-(4-methylbenzyl)-1-(4-morpholine-4-ylphenyl)butane-1-one, 1-[4-(phenylthio)phenyl]-1, 2octanedeione-2(o-benzoyloxime), 1-[9[ethyl-6-(2-methylbenzoyl)-9H-carbazole-3-yl]etanone o-acetyl oxime, or one of the chemicals described by the below formulas:

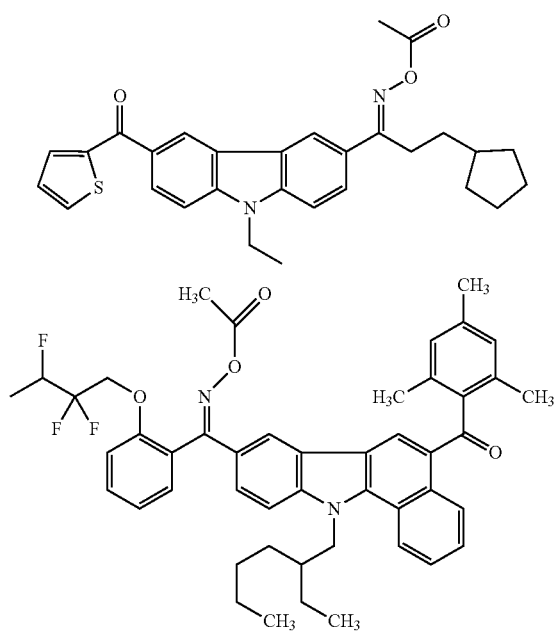

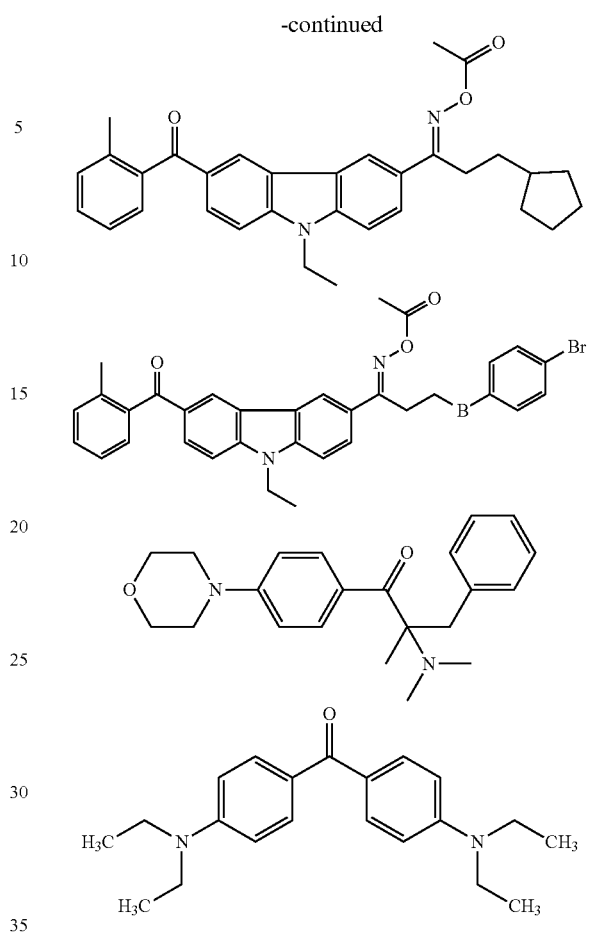

The chemical described by the formula directly above may also be referred to as 4,4'-Bis(diethylamino)benzophenone.

However, as one of ordinary skill in the art will recognize, the chemical compounds listed herein are merely intended as illustrated examples of the additives and are not intended to limit the embodiments to only those additives specifically described. Rather, any suitable additive may be utilized, and all such additives are fully intended to be included within the scope of the present embodiments. In an embodiment, the polymer material comprises about 5% by weight additive.

Once ready, the dielectric layer 124 may be utilized by initially applying the polymer material onto the encapsulant 120, the IC dies 50, and the through vias 116. The dielectric layer 124 may be applied so that the dielectric layer 124 coats an upper exposed surface of the encapsulant 120, the IC dies 50, and through vias 116, and may be applied using a process such as a spin-on coating process, a dip coating method, an air-knife coating method, a curtain coating method, a wire-bar coating method, a gravure coating method, a lamination method, an extrusion coating method, combinations of these, or the like. The dielectric layer 124 may be placed to a thickness in a range of about 2 μm to about 10 μm. In some embodiments, the molding pits 72 are filled by the dielectric layer 124, forming dielectric features 74 as described below in respect to FIG. 13.

Once applied, the dielectric layer 124 may be baked in order to cure and dry the dielectric layer 124 prior to exposure (described further below). The curing and drying of the dielectric layer 124 removes the solvent components while leaving behind the polyamic acid ester, the photosensitizers, the cross-linkers, and any other chosen additives. In an embodiment the pre-bake may be performed at a temperature suitable to evaporate the solvents, such as in a range of about 40° C. and 150° C. The pre-bake is performed for a time sufficient to cure and dry the dielectric layer 124, such as in a range of about 10 seconds to about 5 minutes.

Figure 11:
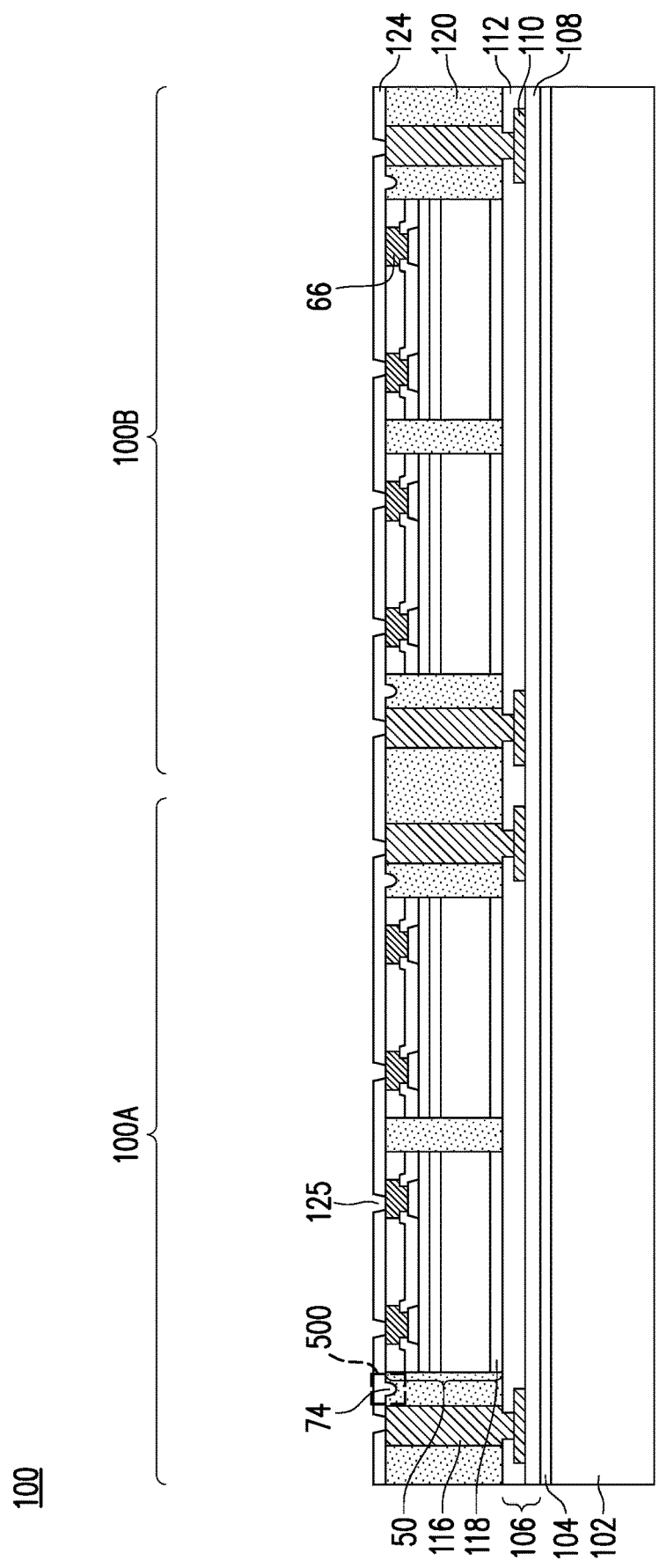
FIG. 11 illustrates a cross-sectional view of a patterning of a dielectric layer of the package component in accordance with some embodiments.

In FIG. 11, once the dielectric layer 124 has been placed, the dielectric layer 124 is patterned to form openings 125 exposing portions of the through vias 116 and the die connectors 66 by, e.g., exposing and developing the material of the dielectric layer 124.

In some embodiments, the energy source supplies energy such as light to the dielectric layer 124 in order to induce a reaction of the photosensitizers, which in turn reacts with the polyamic acid ester to chemically alter those portions of the dielectric layer 124 to which the energy impinges. In an embodiment the energy may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy, such as mercury vapor lamps, xenon lamps, carbon arc lamps or the like, may also be utilized.

A patterned mask is located between the energy source and the dielectric layer 124 in order to block portions of the energy to form a patterned energy prior to the energy actually impinging upon the dielectric layer 124. In an embodiment the patterned mask may comprise a series of layers (e.g., substrate, absorbance layers, anti-reflective coating layers, shielding layers, etc.) to reflect, absorb, or otherwise block portions of the energy from reaching those portions of the dielectric layer 124 which are not desired to be illuminated. The desired pattern may be formed in the patterned mask by forming openings through the patterned mask in the desired shape of illumination.

In some embodiments, the dielectric layer 124 is placed on a support plate. Once the pattern has been aligned to the dielectric layer 124, the energy source generates the desired energy (e.g., light) which passes through the patterned mask on its way to the dielectric layer 124. The patterned energy impinging upon portions of the dielectric layer 124 induces a reaction of the photosensitizers within the dielectric layer 124. The chemical reaction products of the photo sensitizers' absorption of the patterned energy (e.g., acids/bases/free radicals) then reacts with the polyamic acid ester, chemically altering the dielectric layer 124 in those portions that were illuminated through the patterned mask. As described above in respect to FIG. 10, a conversion percentage in a range of about 33% to about 35% may be achieved with an exposure energy less than about 130 mJ, such as in a range of about 90 mJ to about 110 mJ, by using 4-phenyl-2-(piperazin-1-yl)thiazole as the photosensitizer, which may be due to a thiobenzene group with an extra electron in the photosensitizer formula. The resulting higher photosensitivity at relatively lower exposure energies may allow higher resolution of RDL features to be produced.

In some embodiments, the exposure may proceed with a bottom critical dimension (BCD) in a range of about 2 μm and about 200 μm, such as in a range of about 3 μm and about 5 μm. In addition, the exposure latitude (EL) may be greater than about 20% or greater than about 50%, the depth of focus (DOF) may be in a range of about 8 μm and about 30 μm. The exposure energy may be in a range of about 80 mJ and about 300 mJ, and the focus may be in a range of about 6 μm and about 30 μm.

After the dielectric layer 124 has been exposed, a first post-exposure bake (PEB) may be used in order to assist in the generating, dispersing, and reacting of the acid/base/free radical generated from the impingement of the energy upon the photosensitizers during the exposure. Such assistance helps to create or enhance chemical reactions which generate chemical differences and different polarities between those regions impinged by the energy and those regions that were not impinged by the energy. These chemical differences also cause differences in the solubility between the regions impinged by the energy and those regions that were not impinged by the energy. In some embodiments, the temperature of the dielectric layer 124 may be increased to be in a range of about 70° C. and about 130° C. for a period in a range of about 70° C. and about 130° C.

Once the dielectric layer 124 has been exposed and baked, the dielectric layer 124 may be developed with the use of a developer. In an embodiment in which the dielectric layer 124 is the low temperature cured polyimide, the first developer may be a negative tone developer such as an organic solvent or critical fluid that may be utilized to remove those portions of the dielectric layer 124 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include cyclopentanon (A515), hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

The first developer may be applied to the dielectric layer 124 using, e.g., a spin-on process. In this process the first developer is applied to the dielectric layer 124 from above the dielectric layer 124 while the dielectric layer 124 is rotated. In an embodiment the first developer may be at a temperature in a range of about 20° C. and about 40° C., and the development may continue for in a range of about 12 seconds to about 40 seconds.

However, while the spin-on method described herein is one suitable method for developing the dielectric layer 124 after exposure, it is intended to be illustrative and is not intended to limit the embodiments. Rather, any suitable method for development, including dip processes, puddle processes, spray-on processes, combinations of these, or the like, may be used. All such development processes are fully intended to be included within the scope of the embodiments.

Once the dielectric layer 124 has been developed, the dielectric layer 124 may be rinsed. In an embodiment the dielectric layer 124 may be rinsed with a rinsing liquid such as propylene glycol monomethyl ether acetate, although any suitable rinse solution, such as water, may be used.

After development a post development baking process may be utilized in order to help polymerize and stabilize the dielectric layer 124 after the development process. In an embodiment the post-developing baking process may be performed at a temperature of between about 80° C. and about 200° C., or between about 80° C. and about 170° C., for a time of between about 60 sec and about 300 sec.

After the post-development baking and the RDL surface treatments, the dielectric layer 124 may be cured. In an embodiment in which the dielectric layer 124 comprises a low temperature cured polyimide, the curing process may be performed at a low temperature of less than about 230° C., such as a temperature of in a range of about 170° C. and about 230° C., for a time of between about 1 hour and about 2 hours. The temperature may begin at about 23° C. and increase at a rate of about 0.5° C. to about 10° C., e.g., at a rate of about 4.5° C. The system is cooled down at a rate of about 0.5° C./min to about 10° C./min, such as about 1° C./min. In particular embodiments the curing process may be performed at a temperature of about 170° C. for about 1 hour, a temperature of about 180° C. for a time of about 1 hour, or at a temperature of about 160° C. for a time of about 2 hours. However, any suitable temperature and time may be utilized.

In some embodiments in which the polymer material of the dielectric layer 124 is cured at about 230° C., after the curing process, the polymer material of the dielectric layer 124 may have a shrinkage rate of about 85%, a thermomechanical analysis glass transition (TMA-Tg) temperature in a range of about 217° C. to about 219° C., a coefficient of linear thermal expansion (CTE1) of about 50 ppm/° C., a tensile strength in a range of about 184 MPa to about 190 MPa, a Young's modulus of about 3 GPa, and an elongation percentage in a range of about 72% to about 79%. The dielectric layer 124 may contract to a thickness in a range of about 5 μm to about 12 μm.

In some embodiments in which the polymer material of the dielectric layer 124 is cured at about 170° C., after the curing process, the polymer material of the dielectric layer 124 may have a shrinkage rate of about 85%, a thermomechanical analysis glass transition (TMA-Tg) temperature of about 210° C., a coefficient of linear thermal expansion (CTE1) in a range of about 50 ppm/° C. to 51 ppm/° C., a tensile strength in a range of about 175 MPa to about 190 MPa, a Young's modulus of about 3 GPa, and an elongation percentage in a range of about 67% to about 79%. The dielectric layer 124 may contract to a thickness in a range of about 5 μm to about 12 μm.

Figure 12A:
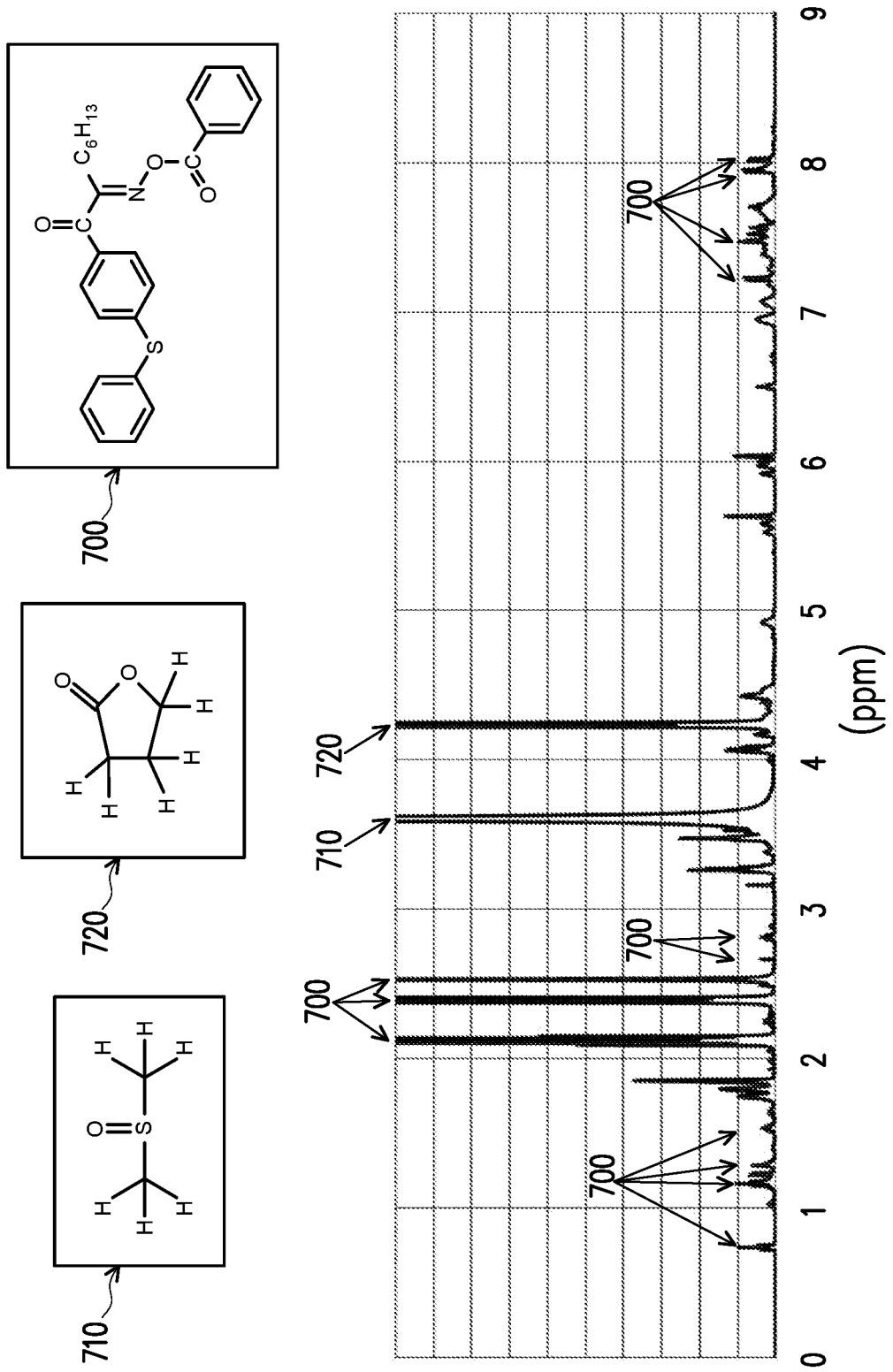
FIGS. 12A and 12B illustrate properties of the dielectric layer of the package component in accordance with some embodiments.
Figure 12B:
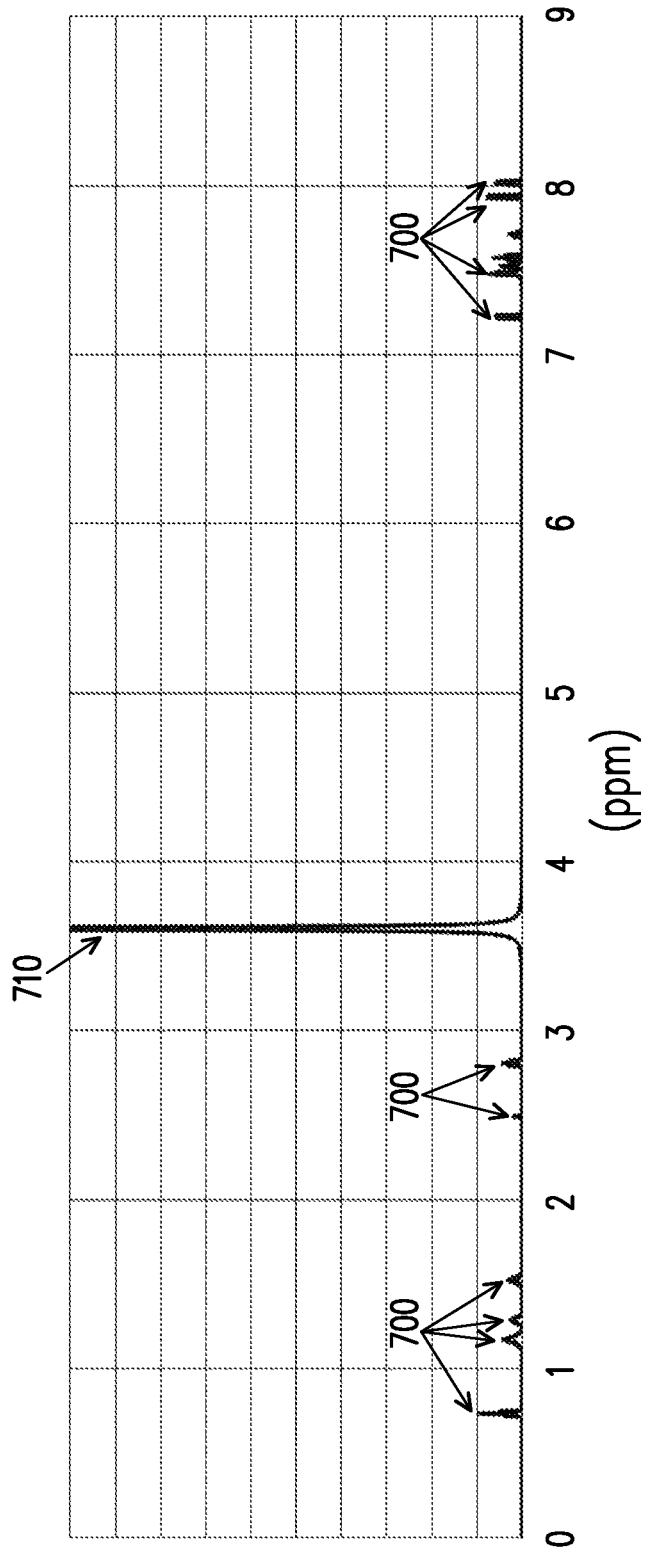

FIGS. 12A and 12B provide mass analysis results illustrating results of the inclusion of embodiments of the additive with embodiments of the polymer material. In some embodiments, the solvent comprises GBL and DMSO and the additive comprises the chemical structure 700:

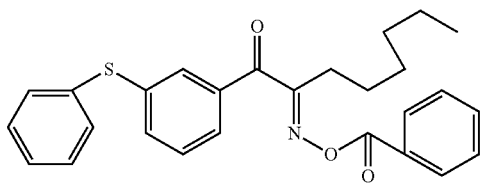 [SMILES: CCCCCC/C(=N\OC(=O)c1ccccc1)C(=O)c1cccc(Sc2ccccc2)c1]

After the polymer material comprising GBL, DMSO and the additive is cured, the polymer material may comprise the following chemical structure 710 from the DMSO:

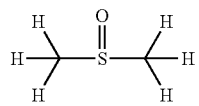

and the polymer material may further comprise the following chemical structure 720 from the GBL:

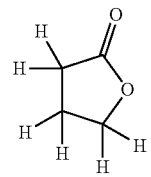

FIG. 12A illustrates the presence of the above chemical structures 700, 710, and 720 as labeled peaks in a nuclear magnetic resonance spectroscopy graph of the polymer material, in accordance with these embodiments.

In some embodiments, the solvent comprises DMSO and the additive comprises the chemical structure 700. FIG. 12B illustrates the presence of the above chemical structures 700 and 710 as labeled peaks in a nuclear magnetic resonance spectroscopy graph of the polymer material, in accordance with these embodiments.

Figure 13:
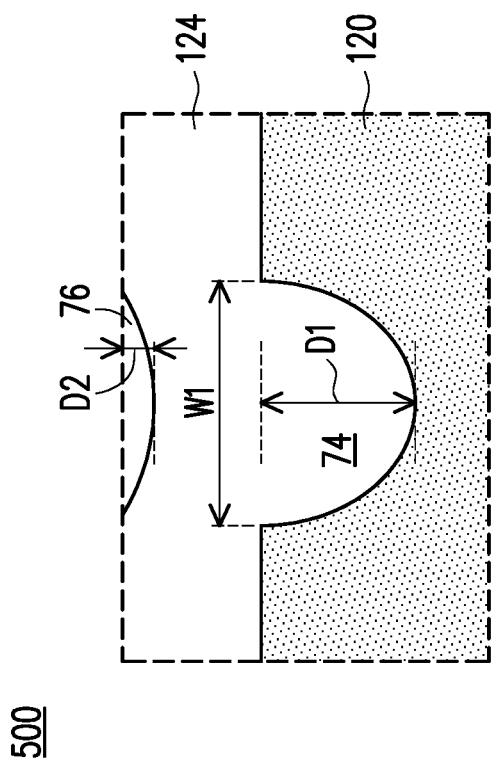
FIGS. 13 through 21 illustrate cross-sectional views of further intermediate steps during a process for forming a package component in accordance with some embodiments.

FIG. 13 illustrates a detailed view of region 500 of FIG. 11, showing a close-up view of dielectric features 74 of the dielectric layer 124, in accordance with some embodiments. In some embodiments, the molding pits 72 are filled by the dielectric layer 124, forming dielectric features 74. After curing, recesses 76 in top surfaces of dielectric features 74 may have depths D2 less than about 1.5 μm. The ratio of the depths D2 to the widths W1 may be less than about 0.16, such as in a range of about 0.006 to about 0.080. The ratio of the depths D2 to the depths W1 may be in a range of about 0.05 to about 0.15. The polymer material of the dielectric layer 124 formed as described above in respect to FIG. 9 may fill the molding pits 72 so that remaining recesses 76 in the dielectric layer 124 have depths of less than about 1.5 μm. This may reduce the rate of bridging defects in the bottom layers of the front-side redistribution structure 122 to a bridge rate of about 0%, which may lower yield loss from broken RDL lines such as in the subsequently formed metallization pattern 126.

Figure 14A:
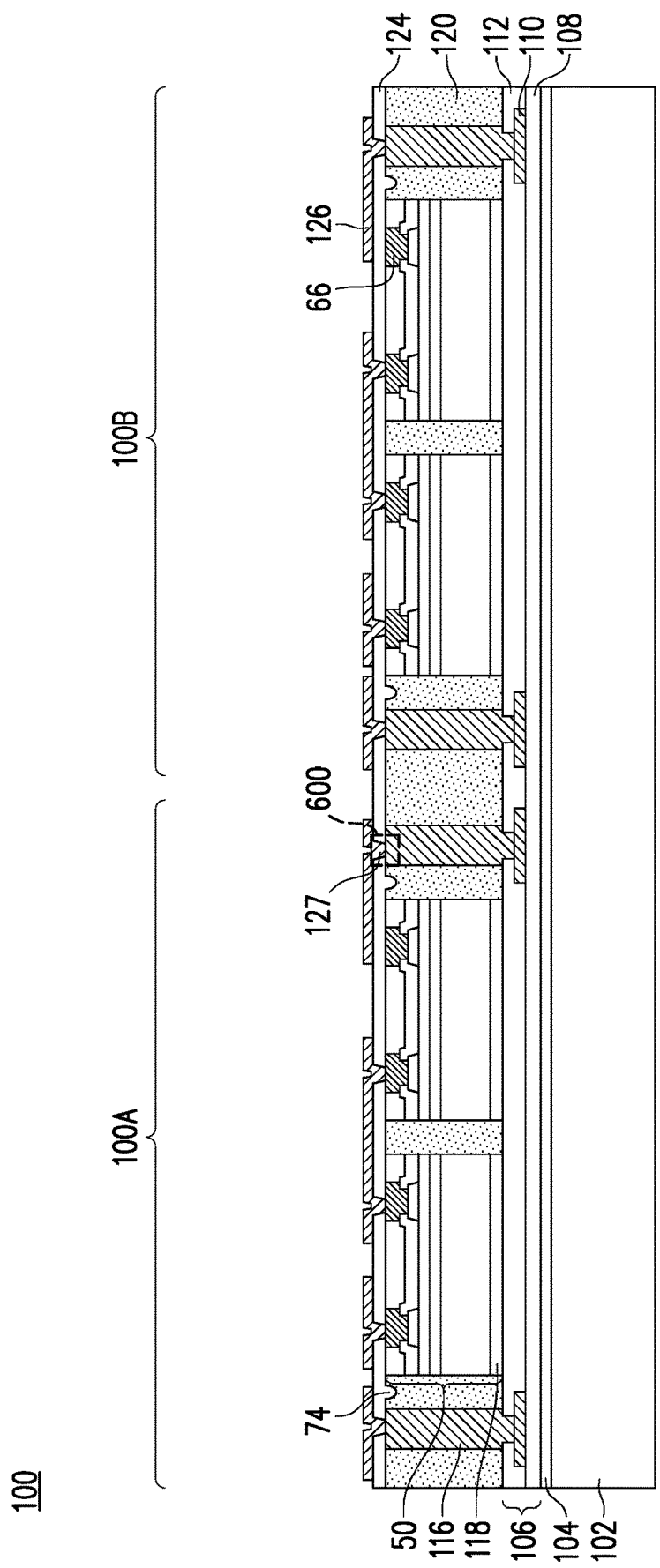

In FIG. 14A, the metallization pattern 126 is then formed. The metallization pattern 126 includes conductive elements extending along the major surface of the dielectric layer 124 and extending through the dielectric layer 124 to physically and electrically couple to the through vias 116 and the integrated circuit dies 50. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126, which includes conductive vias 127 formed in the openings 125. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 14B:
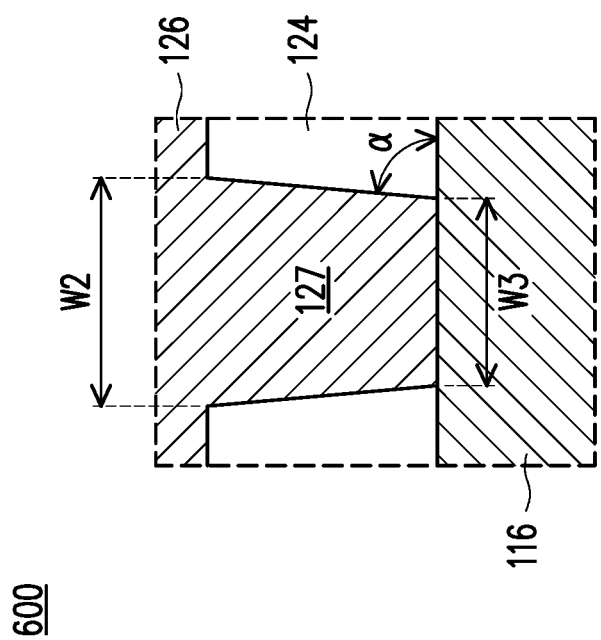

FIG. 14B illustrates a detailed view of region 600 of FIG. 14A, showing a close-up view of a conductive via 127 extending through the dielectric layer 124, in accordance with some embodiments. Although FIG. 14B illustrates the conductive via 127 contacting a top surface of a through via 116, conductive vias 127 may also be formed to contact top surfaces of die connectors 66. The formula of the polymer material of the dielectric layer 124 may allow for the formation of higher resolution features of the metallization pattern 126. For example, the conductive vias 127 may have top widths W2 in a range of about 4.7 µm to about 7.0 µm, bottom widths W3 in a range of about 2.5 µm to about 4.0 µm, and via angles α, measured between a sidewall of the conductive vias 127 and a bottom surface of the dielectric layer 124, in a range of about 70° to about 83°.

Figure 15:
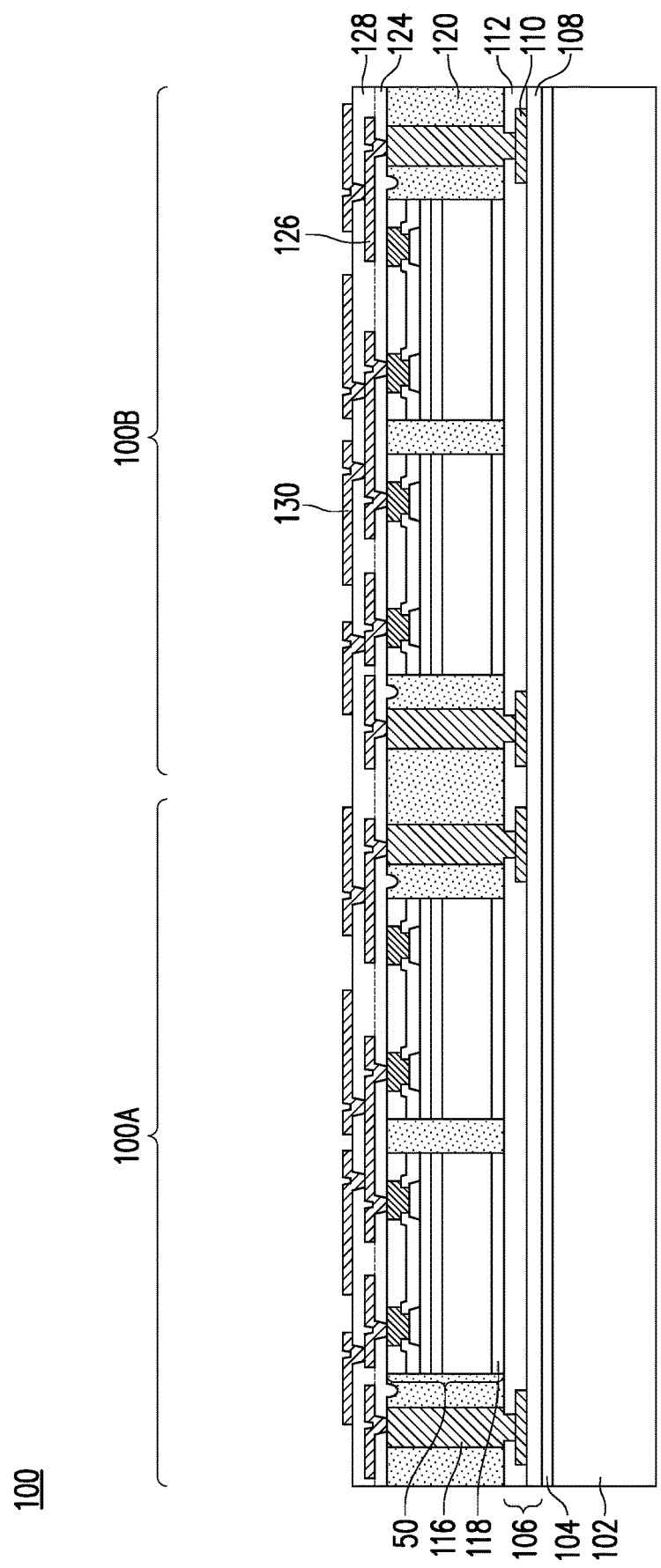

In FIG. 15, the dielectric layer 128 is deposited on the metallization pattern 126 and the dielectric layer 124. The dielectric layer 128 may be formed in a manner similar to the dielectric layer 124, and may be formed of a similar material as the dielectric layer 124. However, any suitable methods and materials may be used. The dielectric layer 128 is then patterned. The patterning forms openings exposing portions of the metallization pattern 126. The patterning may be by an acceptable process, such as by exposing and developing the dielectric layer 126 to light when the dielectric layer 126 is a photo-sensitive material in a manner similar to the patterning of dielectric layer 124 as described above with respect to FIG. 12. However, any suitable patterning process may be utilized.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 16:
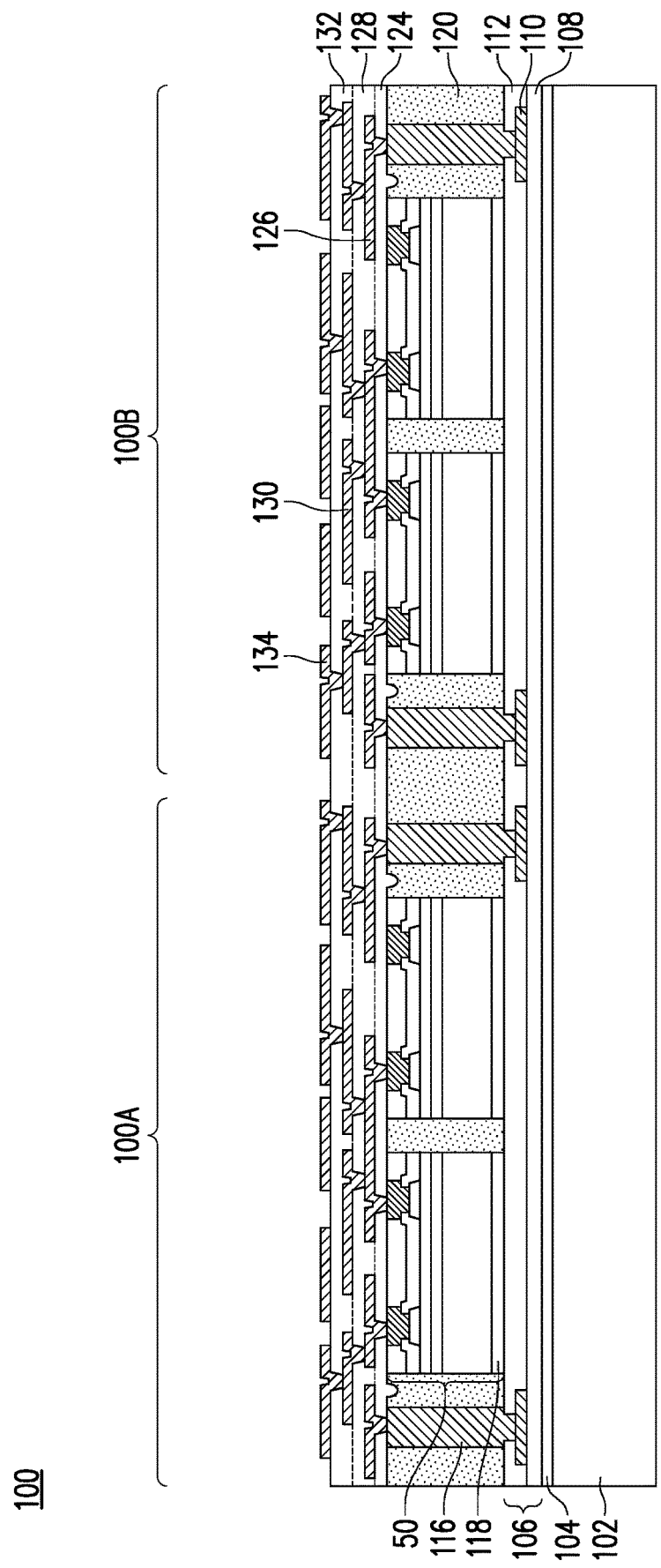

In FIG. 16, the dielectric layer 132 is deposited on the metallization pattern 130 and the dielectric layer 128. The dielectric layer 132 may be formed in a manner similar to the dielectric layer 124, and may be formed of a similar material as the dielectric layer 124. However, any suitable methods and materials may be used.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. The metallization pattern 134 may be formed in a similar manner and of a similar material as the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 17:
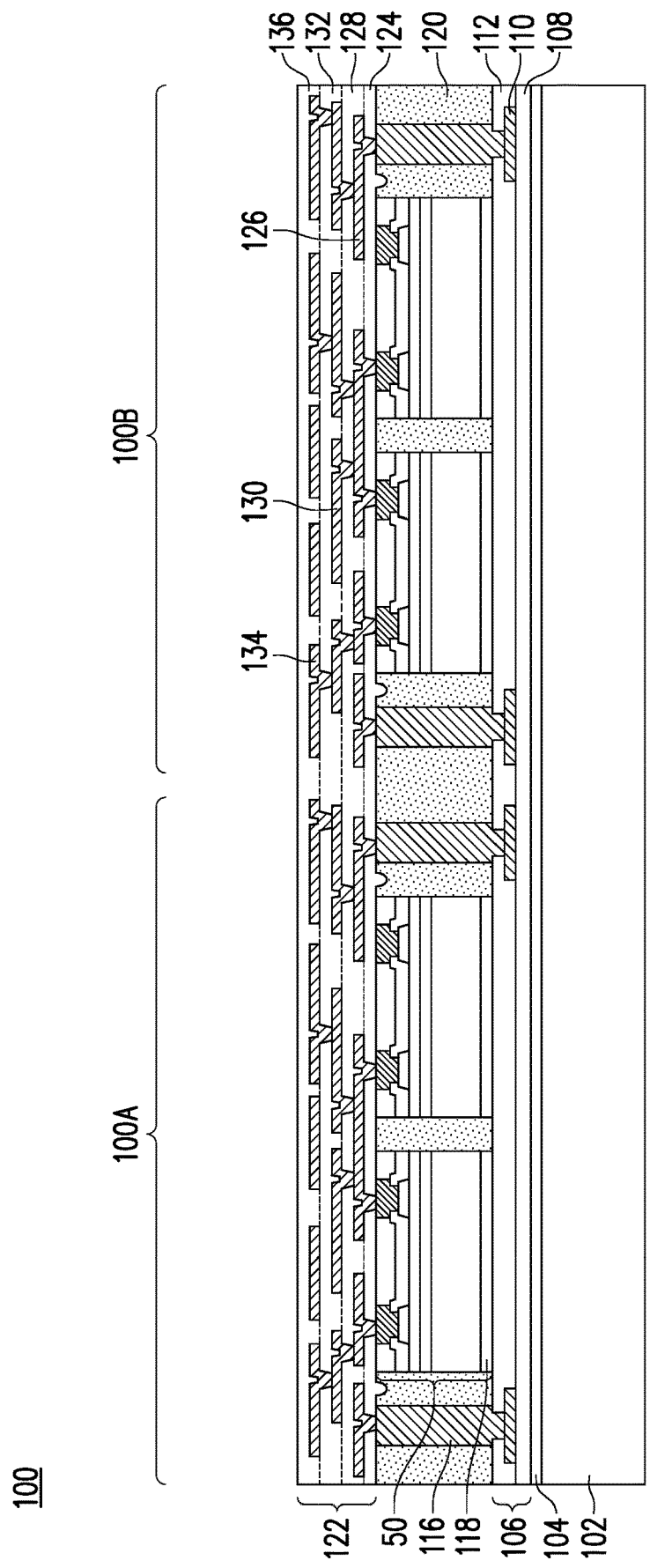

In FIG. 17, the dielectric layer 136 is deposited on the metallization pattern 134 and the dielectric layer 132. The dielectric layer 136 may be formed in a manner similar to the dielectric layer 124, and may be formed of the same material as the dielectric layer 124. However, any suitable methods and materials may be used. The dielectric layer 136 is the topmost dielectric layer of the front-side redistribution structure 122. As such, all of the metallization patterns of the front-side redistribution structure 122 (e.g., the metallization patterns 126, 130, and 134) are disposed between the dielectric layer 136 and the integrated circuit dies 50. Further, all of the intermediate dielectric layers of the front-side redistribution structure 122 (e.g., the dielectric layers 124, 128, 132) are disposed between the dielectric layer 136 and the integrated circuit dies 50.

Figure 18:
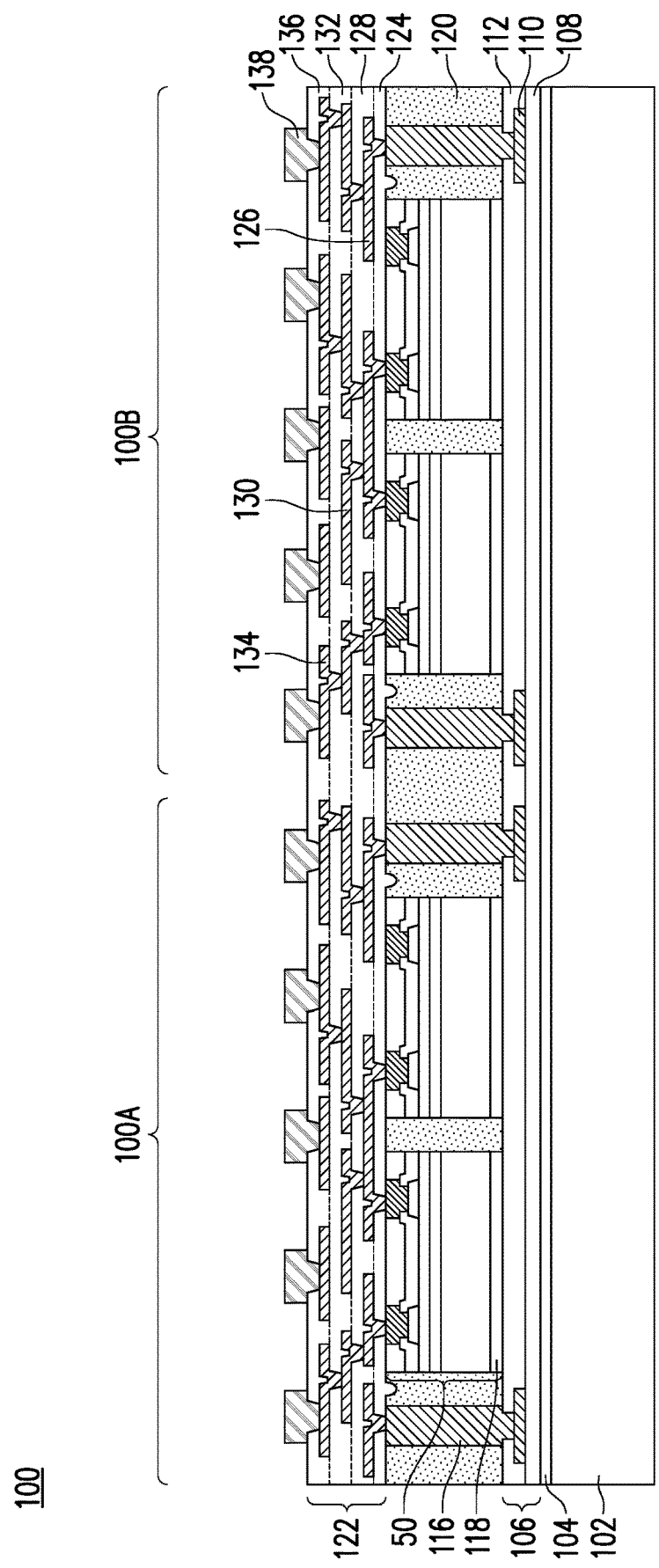

In FIG. 18, UBMs 138 are formed for external connection to the front-side redistribution structure 122. The UBMs 138 have bump portions on and extending along the major surface of the dielectric layer 136, and have via portions extending through the dielectric layer 136 to physically and electrically couple the metallization pattern 134. As a result, the UBMs 138 are electrically coupled to the through vias 116 and the integrated circuit dies 50. The UBMs 138 may be formed of the same material as the metallization pattern 126. In some embodiments, the UBMs 138 have a different size than the metallization patterns 126, 130, and 134.

Figure 19:
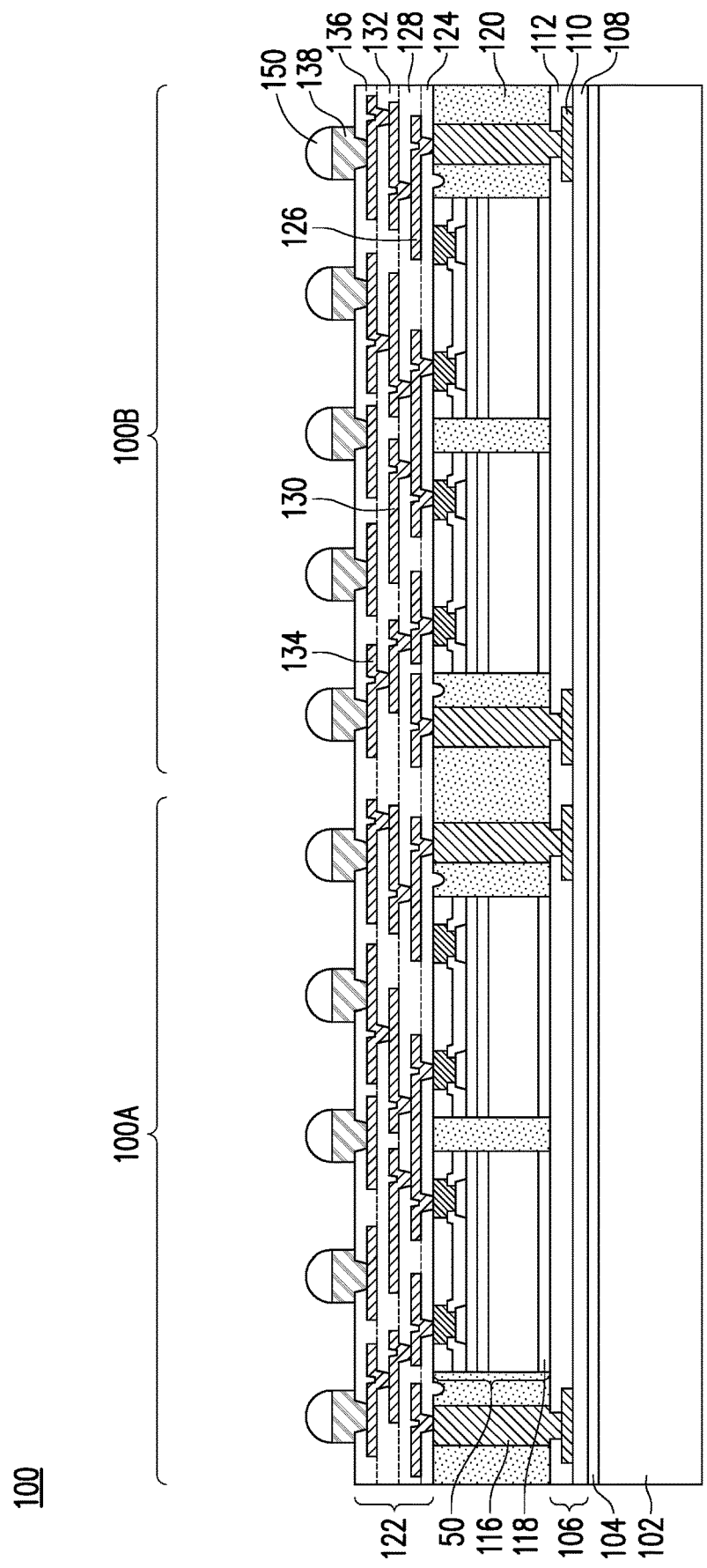

In FIG. 19, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 20:
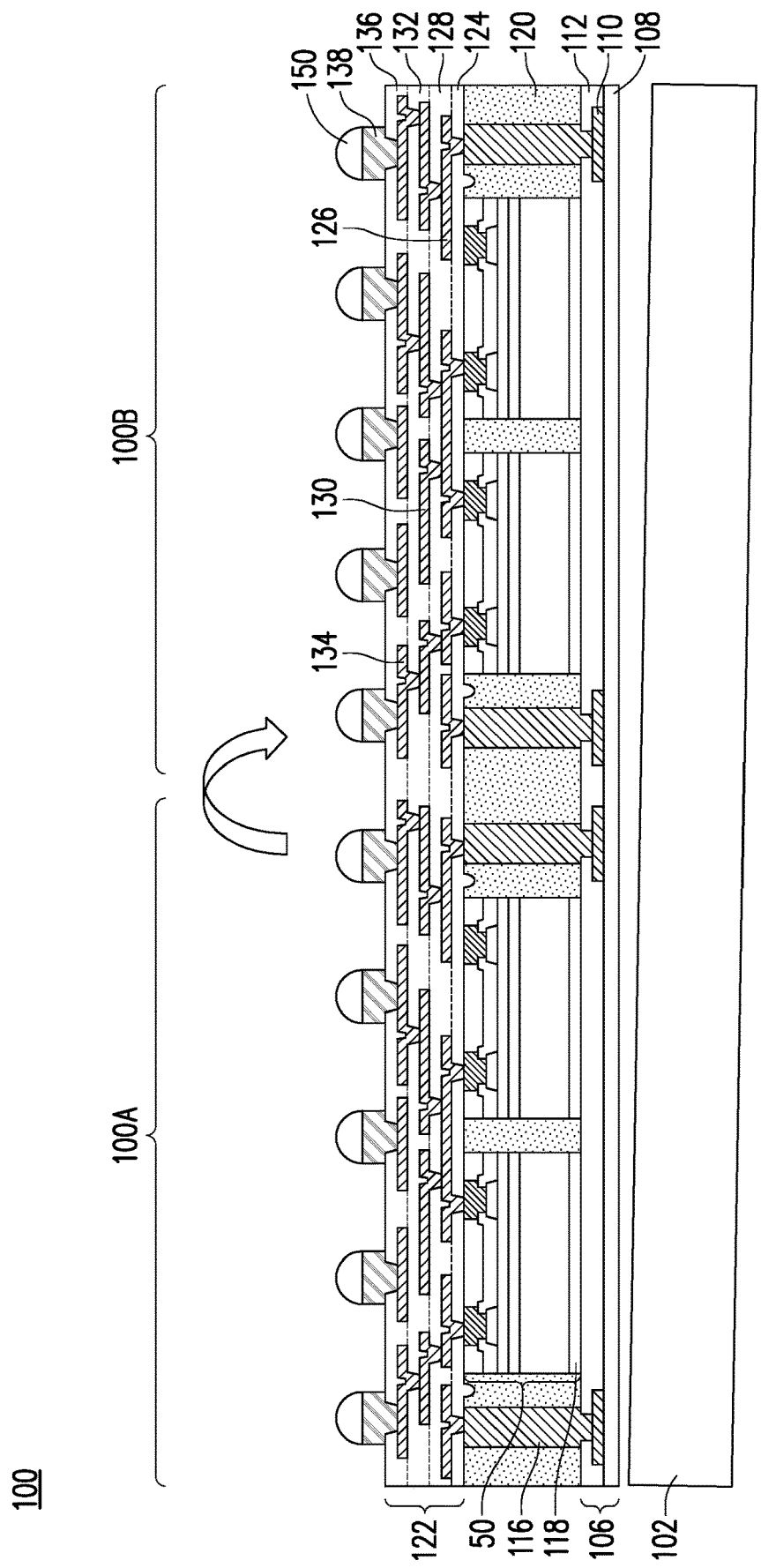

In FIG. 20, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

Figure 21:
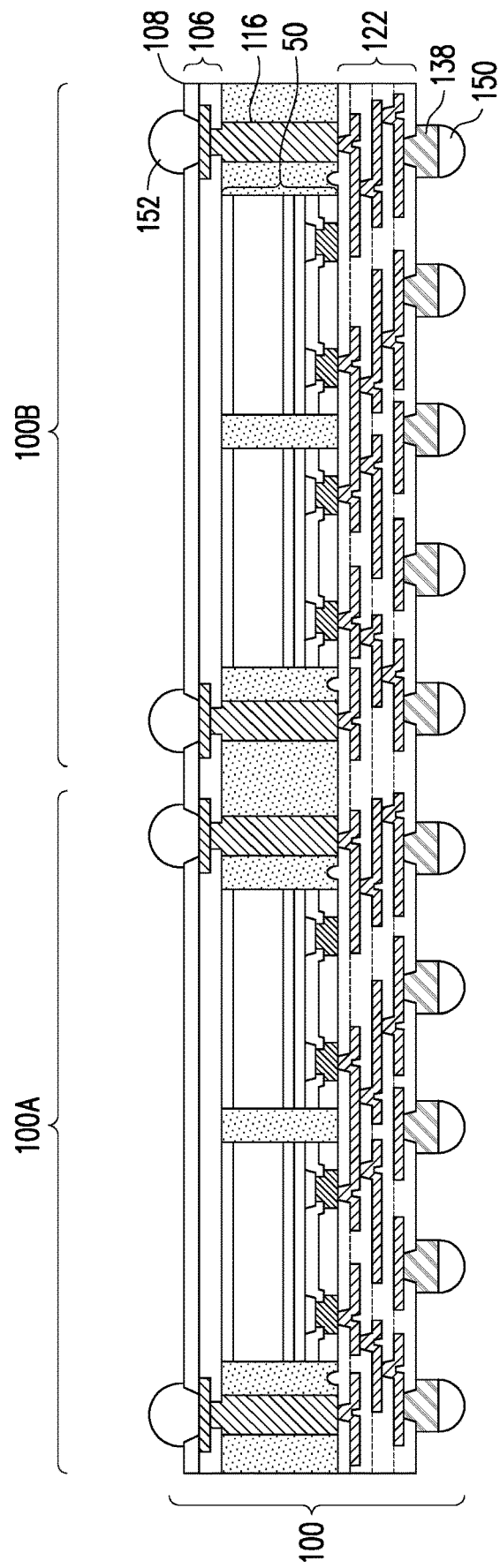

In FIG. 21, conductive connectors 152 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 152 are formed in the openings. In some embodiments, the conductive connectors 152 comprise flux and are formed in a flux dipping process. In some embodiments, the conductive connectors 152 comprise a conductive paste such as solder paste, silver paste, or the like, and are dispensed in a printing process. In some embodiments, the conductive connectors 152 are formed in a manner similar to the conductive connectors 150, and may be formed of a similar material as the conductive connectors 150.

Figure 22:
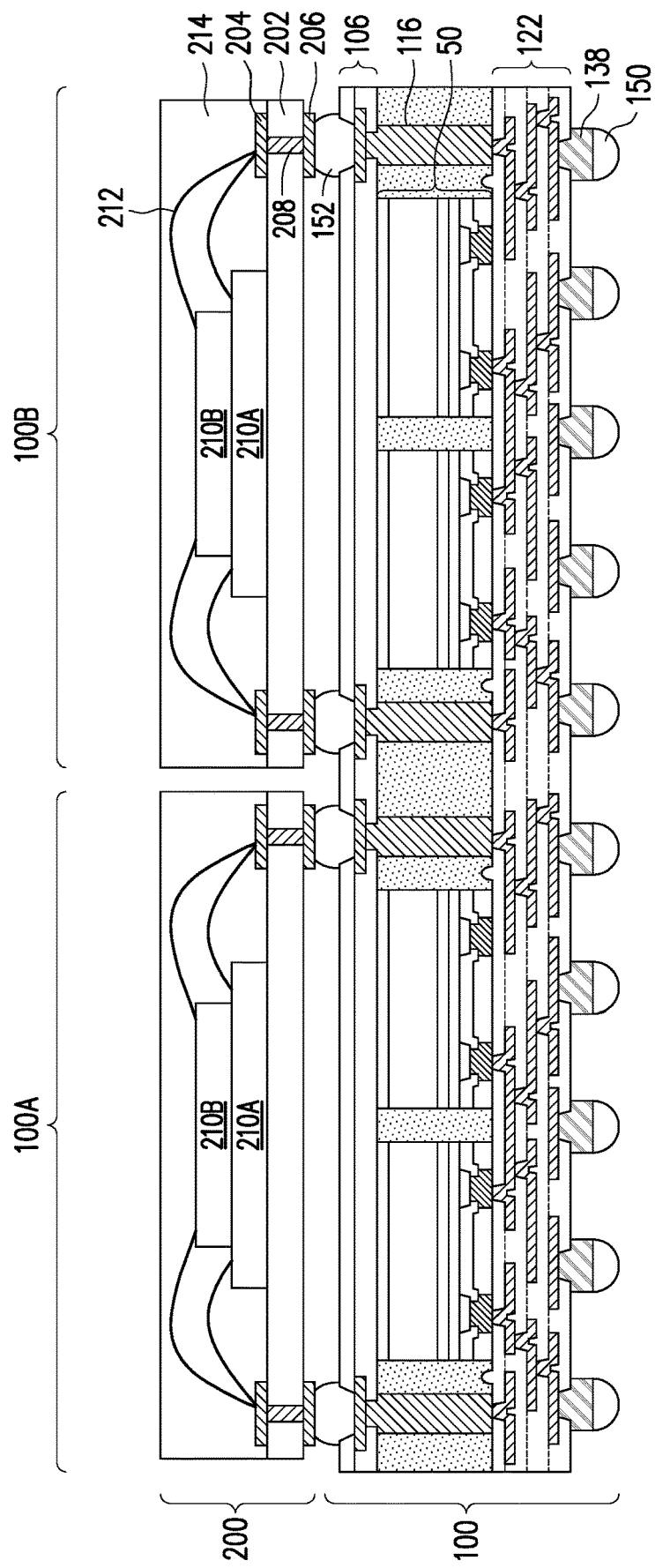
FIGS. 22 and 23 illustrate cross-sectional views of formation and implementation of device stacks in accordance with some embodiments.
Figure 23:
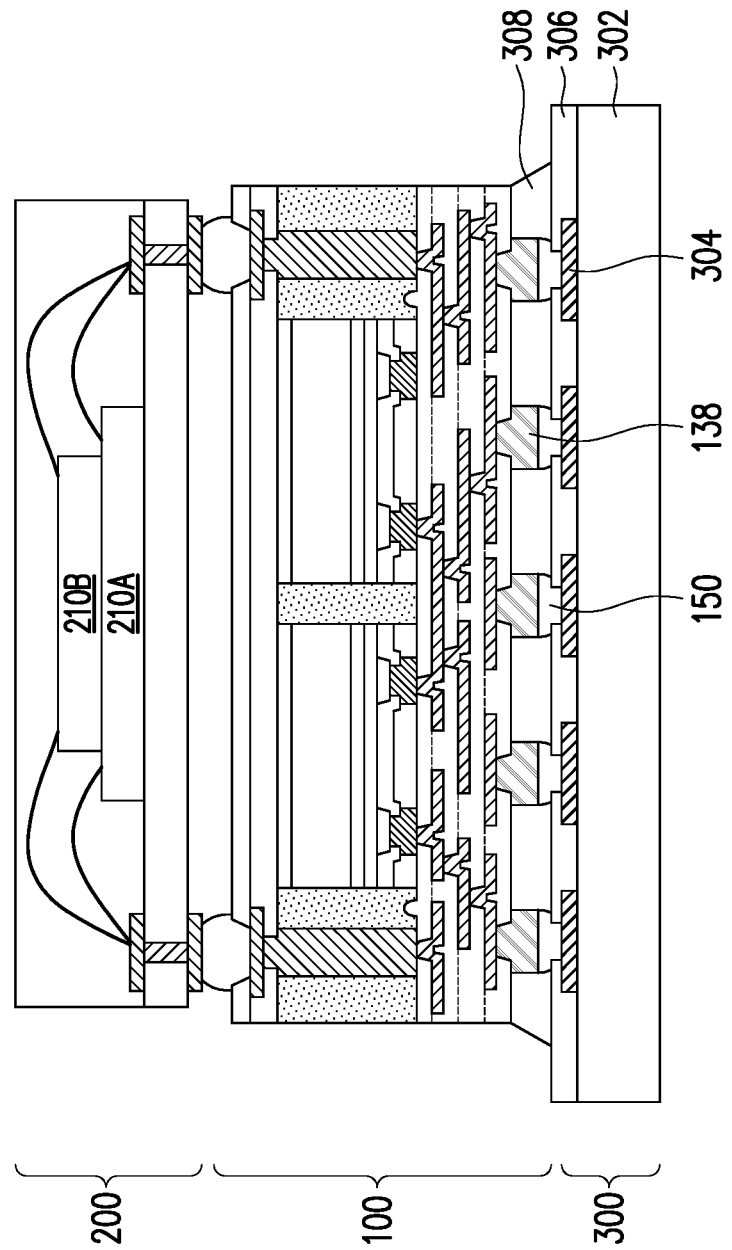

FIGS. 22 and 23 illustrate formation and implementation of device stacks, in accordance with some embodiments. The device stacks are formed from the integrated circuit packages formed in the first package component 100. The device stacks may also be referred to as package-on-package (PoP) or package-on-wafer (PoW) structures.

In FIG. 22, second package components 200 are coupled to the first package component 100. One of the second package components 200 is coupled in each of the package regions 100A and 100B to form an integrated circuit device stack in each region of the first package component 100.

The second package components 200 include, for example, a substrate 202 and one or more stacked dies 210 (e.g., 210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and the conductive vias 208. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 152. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and the bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 152, the bond pads 206, and a metallization pattern of the back-side redistribution structure 106. In some embodiments, the stacked dies 210 may be coupled to the integrated circuit dies 50A and 50B through the wire bonds 212, the bond pads 204 and 206, the conductive vias 208, the conductive connectors 152, the back-side redistribution structure 106, the through vias 116, and the front-side redistribution structure 122.

In some embodiments, a solder resist (not shown) is formed on the side of the substrate 202 opposing the stacked dies 210. The conductive connectors 152 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 152 have an epoxy flux (not shown) formed thereon before they are reflowed with at least some of the epoxy portion of the epoxy flux remaining after the second package components 200 are attached to the first package component 100.

In some embodiments, an underfill (not shown) is formed between the first package component 100 and the second package components 200, surrounding the conductive connectors 152. The underfill may reduce stress and protect the joints resulting from the reflowing of the conductive connectors 152. The underfill may be formed by a capillary flow process after the second package components 200 are attached, or may be formed by a suitable deposition method before the second package components 200 are attached. In embodiments where the epoxy flux is formed, it may act as the underfill.

In FIG. 23, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In some embodiments, the singulation process is performed after the second package components 200 are coupled to the first package component 100. In other embodiments (not shown), the singulation process is performed before the second package components 200 are coupled to the first package component 100, such as after the carrier substrate 102 is de-bonded and the conductive connectors 152 are formed.

Each singulated first package component 100 may then be mounted to a package substrate 300 using the conductive connectors 150. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 150 are reflowed to attach the first package component 100 to the bond pads 304. The conductive connectors 150 electrically and/or physically couple the package substrate 300, including metallization layers in the substrate core 302, to the first package component 100. In some embodiments, a solder resist 306 is formed on the substrate core 302. The conductive connectors 150 may be disposed in openings in the solder resist 306 to be electrically and mechanically coupled to the bond pads 304. The solder resist 306 may be used to protect areas of the substrate 202 from external damage.

The conductive connectors 150 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from reflowing the conductive connectors 150. In some embodiments, an underfill 308 may be formed between the first package component 100 and the package substrate 300 and surrounding the conductive connectors 150. The underfill 308 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 138) or to the package substrate 300 (e.g., to the bond pads 304). For example, the passive devices may be bonded to a same surface of the first package component 100 or the package substrate 300 as the conductive connectors 150. The passive devices may be attached to the package component 100 prior to mounting the first package component 100 on the package substrate 300, or may be attached to the package substrate 300 prior to or after mounting the first package component 100 on the package substrate 300.

The first package component 100 may be implemented in other device stacks. For example, a PoP structure is shown, but the first package component 100 may also be implemented in a Flip Chip Ball Grid Array (FCBGA) package. In such embodiments, the first package component 100 is mounted to a substrate such as the package substrate 300, but the second package component 200 is omitted. Instead, a lid or heat spreader may be attached to the first package component 100. When the second package component 200 is omitted, the back-side redistribution structure 106 and through vias 116 may also be omitted.

While a polymer material forming and patterning process is described as one possible embodiment to form and pattern the dielectric layer 124, the example of the polymer material forming and pattern process for the dielectric layer 124 is intended to be illustrative and is not intended to be limiting. Rather, the polymer material forming and patterning process may be used for any suitable dielectric layer that is formed and/or patterned, such as e.g. the dielectric layers 108 and 112 of the backside redistribution structure 106 as described above with respect to FIG. 3. All such processes are fully intended to be included within the scope of the embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. A formula comprising a polyamic acid ester as a PI precursor, gamma-butyrolactone (GBL) and dimethyl sulfoxide (DMSO) as solvents, tetraethylene glycol dimethacrylate as a cross-linker, and 4-phenyl-2-(piperzain-1-yl)thiazole as a photosensitizer may be used to produce a polyimide (PI) dielectric material for, e.g. redistribution layers (RDLs) of integrated fan-out (InFO) packages. Pollution of the environment can be reduced by using the green, or environmentally friendly, mixing solvents GBL and DMSO. The resolution of RDL features, such as e.g. vias, may be increased from about 8 μm to about 3 μm by using the formula. The PI curing temperature may be reduced to about 170° C. by using the formula, which may lower thermal budget and reduce yield loss from damage to devices such as dynamic random access memory (DRAM) cells. The formula may also provide shorter developing time and lower exposure energy, which may improve production throughput and device reliability, respectively. Forming the PI dielectric material can reduce dimensions of molding pit recesses such as from grinding, which may reduce RDL bridging and resultant yield loss from broken RDL lines.

In accordance with an embodiment, a method of manufacturing a semiconductor device includes: placing a polymer material over a substrate, the polymer material including a polymer precursor, a photosensitizer, the photosensitizer including 4-phenyl-2-(piperazin-1-yl)thiazole, a cross-linker, and a solvent; patterning the polymer material; and curing the polymer material at a temperature in a range of 170° C. to 230° C. In an embodiment, the solvent includes gamma butyrolactone (GBL) and dimethyl sulfoxide (DMSO). In an embodiment, the polymer material before curing includes GBL in a range of 40% to 50% by weight. In an embodiment, the polymer material before curing includes DMSO in a range of 5% to 15% by weight. In an embodiment, the polymer precursor before curing includes a polyamic acid ester. In an embodiment, the polymer material before curing includes the polymer precursor in a range of 25% to 35% by weight. In an embodiment, the polymer material before curing includes the photosensitizer in a range of 0.1% to 2.5% by weight. In an embodiment, the polymer material before curing further includes an additive. In an embodiment, the additive is chosen from the group consisting of 2-Benzyl-2-(dimethylamino)-1-[4-(morpholinyl) phenyl)]-1-butanone, (2-dimethylamino-2-(4-methylbenzyl)-1-(4-morpholine-4-ylphenyl) butane-1-one, 1-[4-(phenylthio)phenyl]-1, 2octanedeione-2 (o-benzoyloxime), and 149[ethyl-6-(2-methylbenzoyl)-9H-carbazole-3-yl]etanone o-acetyl oxime.

In accordance with another embodiment, a method of manufacturing a semiconductor device includes: applying a polymer mixture over a substrate, the polymer mixture including a polymer precursor, a solvent, a cross-linker, the cross-linker including tetraethylene glycol dimethacrylate, the polymer mixture being 2% to 10% cross-linker by weight, and a photosensitizer, the photosensitizer including 4-phenyl-2-(piperazin-1-yl)thiazole; exposing and developing at least a portion of the polymer mixture to form a dielectric layer; curing the dielectric layer; and forming a metallization pattern over the dielectric layer. In an embodiment, the curing the dielectric layer is performed at a temperature in a range of 170° C. to 230° C. In an embodiment, the exposing and the developing at least the portion of the polymer mixture is performed with an exposure energy in a range of 90 mJ to 110 mJ. In an embodiment, the solvent includes dimethyl sulfoxide and gamma butyrolactone. In an embodiment, the polymer mixture further includes an additive, the additive including 4,4'-Bis(diethylamino)benzophenone. In an embodiment, after the curing the dielectric layer the dielectric layer has a tensile strength in a range of 184 MPa to 190 MPa. In an embodiment, the dielectric layer has an elongation percentage in a range of 72% to 79%. In an embodiment, the dielectric layer has a thermomechanical analysis glass transition temperature in a range of 217° C. to 219° C.

In accordance with yet another embodiment, a semiconductor package includes: a die on a first dielectric layer; an encapsulant on the first dielectric layer, the encapsulant encapsulating the die; a through via extending through the encapsulant; and a redistribution structure over the encapsulant, the die, and the through via, the redistribution structure including a second dielectric layer, the second dielectric layer having a tensile strength in a range of 175 MPa to 190 MPa and having a Young's modulus of 3 GPa, and a metallization pattern on the second dielectric layer, the metallization pattern including a first conductive via extending through the second dielectric layer to physically and electrically couple the die and a second conductive via extending through the second dielectric layer to physically and electrically couple the through via. In an embodiment, the second dielectric layer includes the following chemical structure:

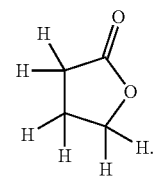

In an embodiment, the second dielectric layer further includes a dielectric feature extending into the encapsulant to a depth greater than 10 µm, the dielectric feature having a width in a range of 15 µm to 25 µm.

In accordance with yet another embodiment, a semiconductor device includes: a die on a substrate; an encapsulant on the substrate, the encapsulant encapsulating the die; and a redistribution structure over the encapsulant and the die, the redistribution structure including a dielectric layer, wherein the dielectric layer includes the following chemical structure:

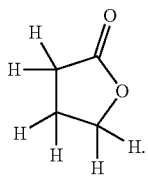

In an embodiment, the dielectric layer further includes the following chemical structure:

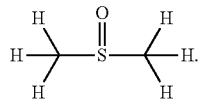

In an embodiment, the dielectric layer has a thermomechanical analysis glass transition temperature in a range of 217° C. to 219° C. In an embodiment, the dielectric layer has a coefficient of linear thermal expansion in a range of 50 ppm/° C. to 51 ppm/° C. In an embodiment, the dielectric layer has a tensile strength in a range of 175 MPa to 190 MPa. In an embodiment, the dielectric layer has a Young's modulus of 3 GPa. In an embodiment, the dielectric layer has an elongation percentage in a range of 67% to 79%. In an embodiment, the dielectric layer has a thickness in a range of 5 µm to 12 µm.

In accordance with yet another embodiment, a semiconductor device includes: an encapsulant over a substrate, the encapsulant encapsulating a semiconductor die; and a redistribution structure over the encapsulant and the semiconductor die, the redistribution structure including a dielectric layer, wherein the dielectric layer includes a dielectric feature extending into the encapsulant to a depth greater than 10 µm, the dielectric feature having a width in a range of 15 µm to 25 µm. In an embodiment, the dielectric layer includes the following chemical structure:

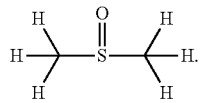

In an embodiment, the dielectric layer includes the following chemical structure:

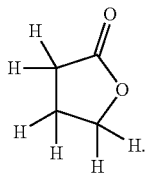

In an embodiment, the redistribution structure further includes a conductive via, the conductive via being through the dielectric layer. In an embodiment, the conductive via has a top width in a range of 4.7 µm to 7.0 µm. In an embodiment, the conductive via has a bottom width in a range of 2.5 µm to 4.0 µm. In an embodiment, an angle measured between a sidewall of the conductive via and a bottom surface of the dielectric layer is in a range of 70° to 83°.

In accordance with yet another embodiment, a semiconductor device includes: a die on a substrate; an encapsulant on the substrate, the encapsulant encapsulating the die; and a redistribution structure over the encapsulant and the die, the redistribution structure including a dielectric layer, the dielectric layer having a tensile strength in a range of 175 MPa to 190 MPa and having a Young's modulus of 3 GPa, wherein the dielectric layer includes a dielectric feature extending into the encapsulant to a depth greater than 10 µm, the dielectric feature having a width in a range of 15 µm to 25 µm. In an embodiment, the dielectric layer includes the following chemical structures:

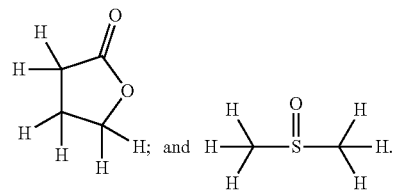

In an embodiment, the dielectric layer has a tensile strength in a range of 184 MPa to 190 MPa. In an embodiment, the dielectric layer has an elongation percentage in a range of 72% to 79%. In an embodiment, the dielectric layer has a thermomechanical analysis glass transition temperature of about 210° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an encapsulant over a substrate, the encapsulant encapsulating a semiconductor die; and
   a redistribution structure over the encapsulant and the semiconductor die, the redistribution structure comprising a dielectric layer, wherein the dielectric layer comprises a dielectric feature extending into the encapsulant to a depth greater than 10 µm, the dielectric feature having a width in a range of 15 µm to 25 µm.

2. The semiconductor device of claim 1, wherein the dielectric layer comprises the following chemical structure:

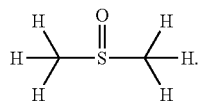

3. The semiconductor device of claim 1, wherein the dielectric layer comprises the following chemical structure:

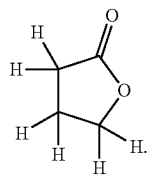

4. The semiconductor device of claim 1, wherein the redistribution structure further comprises a conductive via, the conductive via being through the dielectric layer.

5. The semiconductor device of claim 4, wherein the conductive via has a top width in a range of 4.7 μm to 7.0 μm.

6. The semiconductor device of claim 4, wherein the conductive via has a bottom width in a range of 2.5 μm to 4.0 μm.

7. The semiconductor device of claim 4, wherein an angle measured between a sidewall of the conductive via and a bottom surface of the dielectric layer is in a range of 70° to 83°.

8. A semiconductor device, comprising:
a die on a substrate;
an encapsulant on the substrate, the encapsulant encapsulating the die; and
a redistribution structure over the encapsulant and the die, the redistribution structure comprising a dielectric layer, the dielectric layer having a tensile strength in a range of 175 MPa to 190 MPa and having a Young's modulus of 3 GPa, wherein the dielectric layer comprises a dielectric feature extending into the encapsulant to a depth greater than 10 μm, the dielectric feature having a width in a range of 15 μm to 25 μm.

9. The semiconductor device of claim 8, wherein the dielectric layer comprises the following chemical structures:

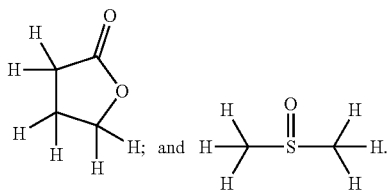

10. The semiconductor device of claim 8, wherein the dielectric layer has a tensile strength in a range of 184 MPa to 190 MPa.

11. The semiconductor device of claim 8, wherein the dielectric layer has an elongation percentage in a range of 72% to 79%.

12. The semiconductor device of claim 8, wherein the dielectric layer has a thermomechanical analysis glass transition temperature of about 210° C.

13. A semiconductor device, comprising:
an encapsulant over a substrate, the encapsulant encapsulating a semiconductor die; and
a redistribution structure over the encapsulant and the semiconductor die, the redistribution structure comprising a dielectric layer, wherein the dielectric layer comprises a dielectric feature extending into the encapsulant to a depth greater than 10 μm, the dielectric feature having a width in a range of 15 μm to 25 μm, wherein the dielectric layer has a thickness in a range of 5 μm to 12 μm.

14. The semiconductor device of claim 13, wherein the dielectric layer comprises the following chemical structure:

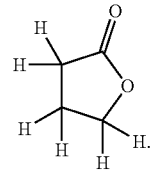

15. The semiconductor device of claim 14, wherein the dielectric layer further comprises the following chemical structure:

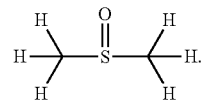

16. The semiconductor device of claim 13, wherein the dielectric layer has a thermomechanical analysis glass transition temperature in a range of 217° C. to 219° C.

17. The semiconductor device of claim 13, wherein the dielectric layer has a coefficient of linear thermal expansion in a range of 50 ppm/° C. to 51 ppm/° C.

18. The semiconductor device of claim 13, wherein the dielectric layer has a tensile strength in a range of 175 MPa to 190 MPa.

19. The semiconductor device of claim 13, wherein the dielectric layer has an elongation percentage in a range of 67% to 79%.

20. The semiconductor device of claim 13, the dielectric layer having a Young's modulus of 3 GPa.

* * * * *